(12) United States Patent
Gee et al.

(10) Patent No.: US 7,144,751 B2
(45) Date of Patent: Dec. 5, 2006

(54) BACK-CONTACT SOLAR CELLS AND METHODS FOR FABRICATION

(75) Inventors: James M. Gee, Albuquerque, NM (US); Peter Hacke, Albuquerque, NM (US)

(73) Assignee: Advent Solar, Inc., Albuquerque, NM (US)

( * ) Notice: Subject to any disclaimer, the term of this patent is extended or adjusted under 35 U.S.C. 154(b) by 0 days.

(21) Appl. No.: 11/050,185

(22) Filed: Feb. 3, 2005

(65) Prior Publication Data

US 2005/0176164 A1    Aug. 11, 2005

Related U.S. Application Data

(60) Provisional application No. 60/542,454, filed on Feb. 5, 2004, provisional application No. 60/542,390, filed on Feb. 5, 2004.

(51) Int. Cl.
H01L 21/22    (2006.01)
H01L 21/38    (2006.01)

(52) U.S. Cl. .................. 438/98; 438/548; 438/558; 438/563; 438/565; 438/928

(58) Field of Classification Search .......... 438/98, 438/548, 549, 558, 561, 563, 565–567, 928; 257/459, 621; 136/255, 256
See application file for complete search history.

(56) References Cited

U.S. PATENT DOCUMENTS

| | | |
|---|---|---|
| 3,903,427 A | 9/1975 | Pack |
| 3,903,428 A | 9/1975 | DeJong |
| 3,936,319 A | 2/1976 | Anthony et al. |
| 4,056,879 A | 11/1977 | Lindmayer |
| 4,152,824 A | 5/1979 | Gonsiorawski |
| 4,165,558 A | 8/1979 | Armitage et al. |
| 4,173,496 A | 11/1979 | Chiang et al. |
| 4,190,852 A | 2/1980 | Warner, Jr. |
| 4,227,942 A | 10/1980 | Hall |
| 4,234,352 A | 11/1980 | Swanson |
| 4,297,391 A | 10/1981 | Lindmayer |
| 4,427,839 A | 1/1984 | Hall |
| 4,478,879 A | 10/1984 | Baraona et al. |
| 4,536,607 A | 8/1985 | Wiesmann |

(Continued)

FOREIGN PATENT DOCUMENTS

EP    0452588 A1    10/1991

(Continued)

OTHER PUBLICATIONS

Eikelboom, D.W.K., et al., "Conductive Adhesives for Interconnection of Busbarless Emitter Wrap-Through Solar Cells on a Structured Metal Foil", *17th European Photovoltaic Solar Energy Conference*, Munich, Germany,(Oct. 22-26, 2001).

(Continued)

*Primary Examiner*—Stephen W. Smoot
(74) *Attorney, Agent, or Firm*—Stephen A. Slusher; Philip D. Askenazy; Peacock Myers, P.C.

(57) ABSTRACT

Methods for fabrication of emitter wrap through (EWT) back-contact solar cells and cells made by such methods. Certain methods provide for higher concentration of dopant in conductive vias compared to the average dopant concentration on front or rear surfaces, and provided increased efficiency. Certain methods provide for selective doping to holes for forming conductive vias by use of printed dopant pastes. Other methods provide for use of spin-on glass substrates including dopant.

17 Claims, 13 Drawing Sheets

U.S. PATENT DOCUMENTS

| | | | |
|---|---|---|---|
| 4,595,790 A | 6/1986 | Basol | |
| 4,626,613 A | 12/1986 | Wenham et al. | |
| 4,663,828 A | 5/1987 | Hanak | |
| 4,663,829 A | 5/1987 | Arakawa et al. | |
| 4,667,058 A | 5/1987 | Catalano et al. | |
| 4,667,060 A | 5/1987 | Spitzer | |
| 4,726,850 A | 2/1988 | Wenham et al. | |
| 4,748,130 A | 5/1988 | Wenham et al. | |
| 4,751,191 A | 6/1988 | Gonsiorawski et al. | |
| 4,838,952 A | 6/1989 | Dill et al. | |
| 4,927,770 A | 5/1990 | Swanson | |
| 5,011,565 A | 4/1991 | Dube et al. | |
| 5,011,782 A | 4/1991 | Lamb et al. | |
| 5,053,083 A | 10/1991 | Sinton | |
| 5,053,355 A | 10/1991 | von Campe | |
| 5,067,985 A | 11/1991 | Carver et al. | |
| 5,103,268 A | 4/1992 | Yin et al. | |
| 5,118,362 A | 6/1992 | St. Angelo et al. | |
| 5,178,685 A | 1/1993 | Borenstein et al. | |
| 5,266,126 A | 11/1993 | Deguchi | |
| 5,425,816 A | 6/1995 | Cavicchi et al. | |
| 5,468,652 A | 11/1995 | Gee | |
| 5,494,832 A | 2/1996 | Lehmann et al. | |
| 5,547,516 A | 8/1996 | Luch | |
| 5,593,901 A | 1/1997 | Oswald et al. | |
| 5,595,607 A | 1/1997 | Wenham et al. | |
| 5,641,362 A | 6/1997 | Meier | |
| 5,646,397 A | 7/1997 | Wenham et al. | |
| 5,797,998 A | 8/1998 | Wenham et al. | |
| 5,871,591 A | 2/1999 | Ruby et al. | |
| 5,899,704 A | 5/1999 | Schlosser et al. | |
| 5,928,438 A | 7/1999 | Salami et al. | |
| 5,942,050 A | 8/1999 | Green et al. | |
| 5,951,786 A | 9/1999 | Gee et al. | |
| 5,972,732 A | 10/1999 | Gee et al. | |
| 5,981,868 A | 11/1999 | Kushiya et al. | |
| 5,990,415 A | 11/1999 | Green et al. | |
| 6,048,442 A | 4/2000 | Kushiya et al. | |
| 6,069,313 A | 5/2000 | Kay | |
| 6,081,017 A | 6/2000 | Kim et al. | |
| 6,091,021 A | 7/2000 | Ruby et al. | |
| 6,092,669 A | 7/2000 | Kushiya et al. | |
| 6,143,976 A | 11/2000 | Endroes | |
| 6,162,658 A | 12/2000 | Green et al. | |
| 6,175,141 B1 | 1/2001 | Hofbauer et al. | |
| 6,180,869 B1 | 1/2001 | Meier et al. | |
| 6,184,056 B1 | 2/2001 | Nakamura et al. | |
| 6,184,057 B1 | 2/2001 | Van Andel et al. | |
| 6,210,991 B1 | 4/2001 | Wenham et al. | |
| 6,262,359 B1 | 7/2001 | Meier et al. | |
| 6,384,316 B1 | 5/2002 | Shinohara et al. | |
| 6,384,317 B1 | 5/2002 | Kerschaver et al. | |
| 6,420,647 B1 | 7/2002 | Ji et al. | |
| 6,429,037 B1 | 8/2002 | Wenham et al. | |
| 6,441,297 B1 * | 8/2002 | Keller et al. | 136/249 |
| 6,538,195 B1 | 3/2003 | Shi et al. | |
| 6,559,479 B1 | 5/2003 | Luedemann | |
| 6,559,497 B1 | 5/2003 | Shih et al. | |
| 6,613,653 B1 | 9/2003 | Naseem et al. | |
| 6,632,730 B1 | 10/2003 | Meier et al. | |
| 6,664,631 B1 | 12/2003 | Meier et al. | |
| 6,703,295 B1 | 3/2004 | Meier et al. | |
| 6,734,037 B1 | 5/2004 | Fath et al. | |
| 6,737,340 B1 | 5/2004 | Meier et al. | |
| 6,777,729 B1 | 8/2004 | Prince et al. | |
| 6,846,984 B1 | 1/2005 | Fath et al. | |
| 2002/0011641 A1 | 1/2002 | Oswald et al. | |
| 2002/0117199 A1 | 8/2002 | Oswald | |
| 2002/0119592 A1 | 8/2002 | Oswald et al. | |
| 2003/0003693 A1 | 1/2003 | Meier et al. | |
| 2003/0008485 A1 | 1/2003 | Meier et al. | |
| 2003/0037815 A1 | 2/2003 | Kim et al. | |
| 2003/0044539 A1 | 3/2003 | Oswald | |
| 2003/0089393 A1 | 5/2003 | Fath et al. | |
| 2003/0102022 A1 | 6/2003 | Fath et al. | |
| 2003/0116185 A1 | 6/2003 | Oswald et al. | |
| 2003/0143827 A1 | 7/2003 | Wenham et al. | |
| 2003/0180983 A1 | 9/2003 | Oswald et al. | |
| 2003/0203603 A1 | 10/2003 | Meier et al. | |
| 2004/0187916 A1 | 9/2004 | Hezel | |
| 2004/0200520 A1 | 10/2004 | Mulligan et al. | |
| 2004/0219801 A1 | 11/2004 | Oswald et al. | |
| 2004/0261839 A1 | 12/2004 | Gee et al. | |
| 2004/0261840 A1 | 12/2004 | Schmit et al. | |
| 2005/0115604 A1 | 6/2005 | Fath et al. | |

FOREIGN PATENT DOCUMENTS

| | | |
|---|---|---|
| JP | 60000783 | 1/1985 |
| JP | 02051282 | 2/1990 |
| WO | WO89/04062 | 5/1989 |
| WO | WO 93/24960 | 12/1993 |
| WO | WO02/25743 A2 | 3/2002 |
| WO | WO 2004/100244 A1 | 11/2004 |

OTHER PUBLICATIONS

Gee, James M., et al., "Back-Contact Crystalline-Silicon Solar Cells and Modules", *NCPV Program Review Meeting*, (Sep. 8-11, 1998), 1-6.

Gee, James M., et al., "Emitter Wrap-Through Solar Cell", *IEEE*, (1993),265-270.

Gee, James M., et al., "Progress on the Emitter Wrap-Through Silicon Solar Cell", *12th European Photovoltaic Solar Energy Conference*, Amsterdam,(Apr. 1994).

Gee, James M., et al., "Simplified Module Assembly Using Back-Contact Crystalline-Silicon Solar Cells", *26th IEEE Photovoltaic Specialists Conference*, (1997), 1085-1088.

Gee, James M., et al., "Simplified Module Assembly Using Back-Contact Cyrstalline-Silicon Solar Cells", *26th PVSC*, Anaheim, California, (1997), 1085-1088.

Gee, James M., et al., "Towards a Manufacturable Back-Contact Emitter-Wrap-Through Silicon Solar Cell", *31st IEEE Photovoltaic Specialists Conference*, Orlando, Florida,(Jan. 2005),3-7.

Hacke, Peter, et al., "Application of Boron Source Diffusion Barrier for the Fabrication of Back Cotnact Silicon Solar Cells", *31st IEEE Photovoltaic Specialists Conference*,Orlando, Florida, (Jan. 2005),3-7.

Hacke, Peter, et al., "Poster for "Application of a Boron Source Diffusion Barrier for the Fabrication of Back Contact Silicon Solar Cells"", *31st IEEE Photovoltaic Specialist Conference*,Orlando, Florida,(Jan. 2005),3-7.

Hilali, M., et al., "Optimization of Self-Doping Ag Paste Firing to Achieve High Fill Factors on Screen-Printed Silicon Solar Cells with a 100 ohm/sq. Emitter", *29th IEEE Photovoltaic Specialists Conference*, New Orleans, Louisiana,(May 2002),356-359.

Meier, D.L., et al., "Self-Doping Contacts to Silicon Using Silver Coated with a Dopant Source", *28th IEEE Photovoltaic Specialists Conference*, (2000),69-74.

Neu, W., et al., "Low-cost multicrystalline back-contact silicon solar cells with screen printed metallization", *Elsevier Solar Energy Materials& Solar Cells*, (2002), 139-146.

Schoenecker, A., et al., "Ace Designs: The Beauty of Rear Contact Solar Cells", *29th IEEE Photovoltaic Specialsists Conference*, New Orleans, USA,(May 20-24, 2002).

Schoenecker, A., et al., "Advanced Crystalline Silicon Solar Cell Designs (ACE)", *Final Report of European Commission project*, JOR3-CT98-02692, (2001).

Schoenecker, A., et al., "An Industrial Multi-Crystalline EWT Solar Cell with Screen Printed Metallisation", *14th Eur. Photovoltaic Solar Energy Conference and Exhibition*, Barcelona, Spain,(1997).

Smith, David D., et al., "Circuit Modeling of the Emitter-Wrap-Through Solar Cell", *IEEE Transactions on Electron Devices*, vol. 46, No. 10,(Oct. 1999).

Smith, D., "Emitter-Wrap Through Solar Cells With Screen-Printed Contacts", *NCPV Program Review Meeting 2000*, NREL Report No. BK-520-28064, (Apr. 16-19, 2000),307.

Smith, David D., et al., "Review of Back Contact Silicon Solar Cells for Low Cost Application", *16th Eur. Photovoltaic Solar Energy Conference and Exhibition*, Glasgow, United Kingdom,(1999).

Tool, C.J.J., et al., "Effect of Water Thickness on the Performance of mc-Si Solar Cells", *17th European Photovoltaic Solar Energy Conference*, Munich, Germany,(2001),paper VC1/40.

Verlinden, P., et al., "Multilevel Metallization for Large Area Point-Contact Solar Cells", *IEEE*, (1988),532-537.

Dicker, J., et al., "Analysis of rear contacted solar cell structures for cost effective processes and materials", *Photovoltaic Specialists Conference, 2000, Conference Record of the Twenty-Eighth IEEE*, Anchorage, Alaska,(Sep. 15-22, 2000),387-390.

Duerinckx, F., et al., "Improved Screen Printing Process for Very Thin Multicrystalline Silicon Solar Cells", *presented at the 19th EPVSEC, Paris*, (2004), 4 pages.

Eikelboom, D.W.K., et al., "Conductive Adhesives for Interconnection of Busbarless Emitter Wrap-Through Solar Cells on a Structured Metal Foil", *presented at the 17th European Photovoltaic Solar Energy Conference, Munich, Germany, Oct. 22-26, 2001*, (Oct. 2001), 4 pages.

Gee, J. M., et al., "Emitter wrap-through solar cell", *Photovoltaic Specialists Conference 1993, Conference Record of the Twenty Third IEEE*, Louisville, Kentucky,(May 10-14, 1993),265-270

Gee, James M., et al., "Simplified Module Assembly Using Back-Contact Crystalline-Silicon Solar Cells", *presented at the 26th IEEE Photovoltaic Specialists Conference, Sep. 29-Oct. 3, 1997, Anaheim, California*, (Sep. 1997), 1085-1088.

Pritchard, Stephen C., "A Comparison of Single Junction and Transistor Structure Solar Cells", *Proceedings of Solar '97, Paper 112*, Australian and New Zealand Solar Energy Society,(1997), 6 pages.

Schneider, A., et al., "AL BSF for Thin Screenprinted Multicrystalline SI Solar Cells", *presented at the 17th Eur. PV Solar Energy Conf., Munich*, (Oct. 2001), 4 pages.

Schneider, A., et al., "Bow Reducing Factors for Thin Screenprinted MC-SI Solar Cells with AL BSF", *presented at the 29th IEEE Photovolatic Specialists Conference, New Orleans, LA*, (336), 4 pages.

Tool, C.J.J., et al., "Effect of Wafer Thickness on the Performance of mc-Si Solar Cells", *presented at the 17th European Photovoltaic Solar Energy Conference, Munich*, (2001), 4 pages.

\* cited by examiner

BACK-CONTACT SOLAR CELLS AND METHODS FOR FABRICATION

CROSS-REFERENCE TO RELATED APPLICATIONS

Related applications entitled "Contact Fabrication of Emitter Wrap-Through Back Contact Silicon Solar Cells", by Peter Hacke and James M. Gee, U.S. Utility patent application Ser. No. 11/050,184, and entitled "Buried-Contact Solar Cells With Self-Doping Contacts", by James M. Gee and Peter Hacke, U.S. Utility patent application Ser. No. 11/050,182, are being filed concurrently herewith, and the specification of each is incorporated herein by reference.

This application claims the benefit of the filing of U.S. Provisional Patent Application Ser. No. 60/542,390, entitled "Fabrication of Back-Contact Silicon Solar Cells", filed on Feb. 5, 2004, and of U.S. Provisional Patent Application Ser. No. 60/542,454, entitled "Process for Fabrication of Buried-Contact Cells Using Self-Doping Contacts", filed on Feb. 5, 2004, and the specifications thereof are incorporated herein by reference.

BACKGROUND OF THE INVENTION

1. Field of the Invention (Technical Field):

The present invention relates to methods for making back-contact solar cells, and particularly emitter wrap through (EWT) solar cells with conductive vias, and solar cells made by such methods.

2. Description of Related Art:

Note that the following discussion refers to a number of publications by author(s) and year of publication. Discussion of such publications herein is given for more complete background and is not to be construed as an admission that such publications are prior art for patentability determination purposes.

The solar cell design in widespread use today has a p/n junction formed near the front surface (that surface which receives the light) which creates an electron flow as light energy is absorbed in the cell. The conventional cell design has one set of electrical contacts on the front side of the cell, and a second set of electrical contacts on the rear side of the solar cell. In a typical photovoltaic module these individual solar cells are interconnected electrically in series to increase the voltage. This interconnection is typically accomplished by soldering a conductive ribbon from the front side of one solar cell to the rear side of an adjacent solar cell.

Back-contact silicon solar cells have several advantages compared to conventional silicon solar cells. The first advantage is that back-contact cells have a higher conversion efficiency due to reduced or eliminated contact obscuration losses (sunlight reflected from contact grid is unavailable to be converted into electricity). The second advantage is that assembly of back-contact cells into electrical circuits is easier, and therefore cheaper, because both polarity contacts are on the same surface. As an example, significant cost savings compared to present photovoltaic module assembly can be achieved with back-contact cells by encapsulating the photovoltaic module and the solar cell electrical circuit in a single step. The last advantage of a back-contact cell is better aesthetics through a more uniform appearance. Aesthetics is important for some applications, such as building-integrated photovoltaic systems and photovoltaic sunroofs for automobiles.

FIG. 1 provides an illustration of a generic back-contact solar cell 10. The silicon substrate 12 may be n-conductivity type or p-conductivity type. One of the heavily doped emitters, such as $p^{++}$ doped emitter 18 or $n^{++}$ doped emitter 16 may be omitted in some designs. Alternatively, the heavily doped emitters 16, 18 may directly contact each other on the rear surface in other designs. Rear-surface passivation 14 helps reduce loss of photogenerated carriers at the rear surface, and helps reduce electrical losses due to shunt currents at undoped surfaces between the metal contacts 20.

There are several approaches for making a back-contact silicon solar cell. These approaches include metallization wrap around (MWA), metallization wrap through (MWT), emitter wrap through (EWT), and back-junction structures. MWA and MWT have metal current collection grids on the front surface. These grids are, respectively, wrapped around the edge or through holes to the back surface in order to make a back-contact cell. The unique feature of EWT cells, in comparison to MWT and MWA cells, is that there is no metal coverage on the front side of the cell, which means that none of the light impinging on the cell is blocked, resulting in higher efficiencies. The EWT cell wraps the current-collection junction ("emitter") from the front surface to the rear surface through doped conductive channels in the silicon wafer. "Emitter" refers to a heavily doped region in a semiconductor device. Such conductive channels can be produced by, for example, drilling holes in the silicon substrate with a laser and subsequently forming the emitter inside the holes at the same time as forming the emitter on front and rear surfaces. Back-junction cells have both the negative and positive polarity collection junctions on the rear surface of the solar cell. Because most of the light is absorbed—and therefore also most of the carriers are photogenerated—near the front surface, back-junction cells require very high material quality so that carriers have sufficient time to diffuse from the front to the rear surface with the collection junctions on the rear surface. In comparison, the EWT cell maintains a current collection junction on the front surface, which is advantageous for high current collection efficiency. The EWT cell is disclosed in U.S. Pat. No. 5,468,652, Method Of Making A Back Contacted Solar Cell, to James M. Gee, incorporated here in full. The various other back-contact cell designs have also been discussed in numerous technical publications.

In addition to U.S. Pat. No. 5,468,652, two other U.S. patents on which Gee is a co-inventor disclose methods of module assembly and lamination using back-contact solar cells, U.S. Pat. No. 5,951,786, Laminated Photovoltaic Modules Using Back-Contact Solar Cells, and U.S. Pat. No. 5,972,732, Method of Monolithic Module Assembly. Both patents disclose methods and aspects that may be employed with the invention disclosed herein, and are incorporated by reference as if set forth in full. U.S. Pat. No. 6,384,316, Solar Cell and Process of Manufacturing the Same, discloses an alternative back-contact cell design, but employing MWT, wherein the holes or vias are spaced comparatively far apart, with metal contacts on the front surface to help conduct current to the rear surface, and further in which the holes are lined with metal.

Under certain conditions, EWT cells with gas dopant diffused vias exhibit high series resistance associated with conduction through the vias. [J. M. Gee, M. E. Buck, W. K. Schubert, and P. A. Basore, Progress on the Emitter Wrap-Through Silicon Solar Cell, 12th European Photovoltaic Solar Energy Conference, Amsterdam, The Netherlands, April 1994]; Gee J M, Smith D D, Garrett S E, Bode M D, Jimeno J C: Back-Contact Crystalline-Silicon Solar Cells and Modules. *NCPV Program Review Meeting,* 8–11 Sep. 1998, Denver, Colo. One approach to addressing this problem is to fill vias with metal, such as plated metal. However, this approach adds significant complexity to the manufacturing process and is accordingly more expensive. Another approach is to increase the density of vias such that an acceptable series resistance is attained. However, this also adds complexity and cost. A preferred approach is to dope the holes more heavily than the surfaces, as long as the process maintains simplicity and low cost. At least some data suggests that conventional gas diffusion, such as gas phase diffusion using liquid $POCl_3$, results in less diffusion within the hole than on horizontal or planar surfaces, possibly because dopant gasses do not penetrate to the interior of the hole as effectively as to an exposed surface. However, other data found that the hole conductivity was high and consistent with interior doping similar to the exposed surfaces [D. D. Smith, J. M. Gee, M. D. Bode, J. C. Jimeno, *Circuit modeling of the emitter-wrap-through solar cell,* IEEE Trans. on Electron Devices, Vol. 46, 1993 (1999)].

A critical issue for any back-contact silicon solar cell is developing a low-cost process sequence that also electrically isolates the negative and positive polarity grids and junctions. The technical issue includes patterning of the doped layers (if present), passivation of the surface between the negative and positive contact regions, and application of the negative and positive conductivity contacts.

BRIEF SUMMARY OF THE INVENTION

The present invention is a method for making an emitter wrap through (EWT) solar cell, the method comprising the steps of: providing a semiconductor wafer with a front surface and a rear surface and a plurality of holes connecting the front surface to the rear surface; applying a first dopant diffusion source on the rear surface in a pattern comprising the rear surface holes; applying a second dopant diffusion source on the rear surface in a pattern not comprising the rear surface holes; and diffusing dopants from the first dopant diffusion source and the second dopant diffusion source into the semiconductor wafer by firing. The semiconductor wafer preferably comprises silicon, the first dopant source preferably comprises phosphorus and the second dopant source preferably comprises boron. The method preferably further comprises the step of applying the first dopant diffusion source comprising phosphorus to the front surface in a pattern comprising the front surface holes. In the step of applying the first dopant diffusion source at least a portion of the holes are preferably filled with the first dopant diffusion source.

The method preferably further comprises the steps of: etching the semiconductor wafer with an acid solution following the diffusion step; applying a dielectric layer for passivation to at least the front surface of the etched semiconductor wafer; and applying a first conductivity type metal grid to the rear surface in a pattern comprising at least a portion of the first dopant diffusion source pattern and a second conductivity type metal grid to the rear surface in a pattern comprising at least a portion of the second dopant diffusion source pattern.

The invention is also another method for making an EWT solar cell, the method comprising the steps of: providing a semiconductor wafer with a front surface and a rear surface and a plurality of holes connecting the front surface to the rear surface; applying a diffusion barrier to the rear surface in a pattern not comprising the rear surface holes; cleaning the wafer; diffusing a first dopant into the wafer; etching the wafer to at least partially remove surface oxides; and applying a first conductivity type metal grid to the rear surface in a pattern comprising the rear surface holes and a second conductivity type metal grid to the rear surface in a pattern separated from the first conductivity type metal grid by the diffusion barrier pattern. The semiconductor wafer preferably comprises p-type silicon, the first dopant preferably comprises phosphorus, the first conductivity type metal grid preferably comprises silver, and the second conductivity type metal grid preferably comprises aluminum.

This method preferably further comprises the step of applying a dielectric layer for passivation to at least a portion of the surface of the p-type silicon wafer following the etch step; wherein application of the first dopant phosphorus source results in a resistance of between about 30 and 60 Ω/sq; and wherein the step of applying first and second conductivity type metal grids comprises printing grid patterns and firing. The diffusion source preferably comprises a second dopant of opposite conductivity type to the first dopant. The first dopant preferably comprises phosphorus and the second dopant forming a part of the diffusion barrier preferably comprises boron. The first dopant and second dopant are preferably simultaneously diffused into the wafer.

The present invention is also a further method for making an EWT solar cell, the method comprising the steps of: providing a semiconductor wafer with a front surface and a rear surface and a plurality of holes connecting the front surface to the rear surface; applying a first spin-on glass (SOG) diffusion barrier to the rear surface; applying a resist in a pattern not comprising the rear surface holes; etching the wafer to remove first SOG not covered by the patterned resist; stripping the resist from the wafer; diffusing a first dopant into the wafer; etching the wafer to at least remove remaining first SOG; and applying a first conductivity type metal grid to the rear surface in a pattern comprising the rear surface holes and a second conductivity type metal grid to the rear surface in a pattern comprising the resist pattern. The semiconductor wafer preferably comprises silicon, the first dopant preferably comprises phosphorus and applying the first SOG preferably comprises application by spinning or spraying and furnace densification. The first SOG preferably comprises a second dopant of opposite conductivity type to the first dopant.

The present invention is also another method for making an EWT solar cell, the method comprising the steps of: providing a semiconductor wafer with a front surface and a rear surface and a plurality of holes connecting the front surface to the rear surface; applying a first SOG comprising a first dopant to the rear surface; applying a resist in a pattern not comprising the rear surface holes; etching the wafer to remove first SOG not covered by the patterned resist; stripping the resist from the wafer; applying a second SOG comprising a second dopant of opposite conductivity type to the first dopant to the rear surface; firing the wafer to diffuse the first dopant and second dopant into the wafer; etching the wafer to at least remove remaining first and second SOG; and applying a first conductivity type metal grid to the rear surface in a pattern comprising the rear surface holes and a second conductivity type metal grid to the rear surface in a pattern comprising the resist pattern. This method further preferably comprises the step of applying a third SOG to the front surface of the wafer, the third SOG preferably comprising a lower concentration of second dopant than is in the second SOG. In this method, firing preferably comprises firing with a plurality of wafers arrayed approximately parallel and front surface to back surface, whereby second dopant from the second SOG on the back surface of a first wafer is diffused to the immediately adjacent front surface of an immediately adjacent second wafer.

The invention is further an EWT solar cell made by any of the foregoing methods.

A primary object of the present invention is to provide higher efficiency EWT solar cells made by a simple and cost effective manufacturing process.

Another object of the present invention is to provide a method for increased doping within conductive vias, thereby providing for EWT solar cells with decreased series resistance.

Another object of the present invention is to provide a manufacturing process employing diffusion barriers, and preferably diffusion barriers which also serve as a dopant source, to provide for improved back-contact junction properties.

Yet another object of the present invention is to provide for discrete but simultaneous diffusion of two different dopants, an n-dopant and p-dopant.

A primary advantage of the present invention is that it provides improved and simpler methods of producing EWT solar cells at a decreased cost.

Yet another advantage of the present invention is that it provides methods wherein conductive vias and associated grid lines on the rear surface, and optionally dopant lines on the front surface, are more heavily doped with an $n^+$-dopant, preferably phosphorus, than are the remaining surface areas.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings.

DETAILED DESCRIPTION OF THE INVENTION

Figure 1:
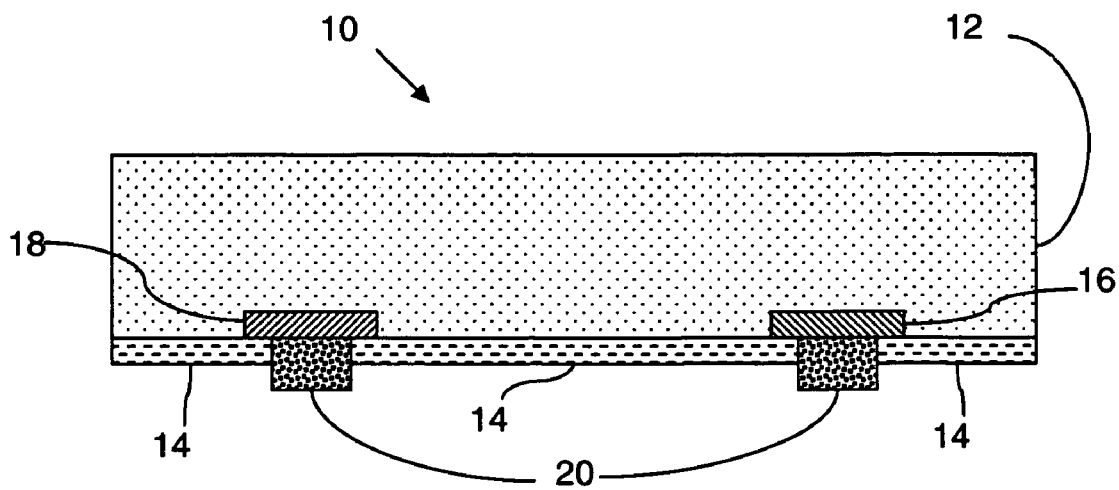
FIG. 1 is an illustration of a generic back-contact solar cell 10.

The invention disclosed herein provides for improved methods and processes for fabrication of back-contact solar cells, particularly methods and processes providing for simpler, more reliable and more economical fabrication. It is to be understood that while a number of different discrete methods are disclosed, one of skill in the art could combine or vary two or more methods, thereby providing an alternative additional method of fabrication. It is also to be understood that while the figures and example process sequences describe fabrication of back-contact EWT cells, certain of these process sequences can be used for fabrication of other back-contact cell structures such as MWT, MWA, or back-junction solar cells. In particular, the methods under the headings "Use of Printed Diffusion Barriers and Dopant Diffusion Barriers" and "Use of Spin-On Glass Diffusion Barrier" and "Use of Spin-On Glasses as Diffusion Barrier and Dopant Sources" can be directly applied to any back-contact solar cell, including but not limited to MWT, MWA and back-junction solar cells. It will be readily recognized by one of skill in the art that certain modifications are to be made based upon the difference in structures of the cells, but nonetheless the methods are generally applicable to back-contact cells.

In certain embodiments, the methods of this invention provide for EWT cells with heavier doping (which may be $p^{++}$ or $n^{++}$) within the body of the via, which is to say within the roughly cylindrical side walls of the via, and associated grid lines or front surface dopant lines, compared to the remaining horizontal cell surfaces, and more particularly the remaining front or top surface, which is also doped, but more lightly. For example in a p-type silicon wafer, the conductive vias will be more heavily $n^{++}$-doped than is the majority of the front surface. Preferably, in certain embodiments $n^{++}$-doped lines including the via opening are formed on the front surface, corresponding to the rear surface grid line, and optionally further including right angle $n^{++}$-doped lines intersecting at vias, are provided, with the remaining areas of the front surface more lightly $n^+$-doped. Thus the resistance is less for current transported to the via and through the via rather than using a single $n^+$ emitter for both the surfaces and vias. This results in increased efficiency and permits a decrease in hole density without the need for metallization of the via.

In each of the methods hereafter described, the wafer can be a conventional thickness, typically greater than 280 to 300 μm, such as a conventional 330 μm wafer. Alternatively, in the process sequence of this invention the wafer can be substantially thinner, such as less than about 280 μm, preferably less than about 200 μm, and more preferably less than about 100 μm. Thin silicon wafers can be employed because the process sequence does not include a metal, such as an aluminum alloy, covering all or substantially the entire rear surface of the wafer, typically used to provide a back surface field (BSF) to reduce recombination losses ("passivation") at the rear surface. Because of strains due to the coefficient of thermal expansion mismatch between the wafer and the back surface field BSF (the thermal expansion coefficient of Al is over 10× larger than that of Si), typically wafers of greater than 280 microns thickness are employed. In this context, the teaching of commonly owned U.S. patent application Ser. No. 10/880,190, entitled "Emitter Wrap-Through Back Contact Solar Cells On Thin Silicon Wafers," to Gee and Schmit, and filed on Jun. 29, 2004, is incorporated by reference as if set forth in full. The wafer may be of any area, such as 25 cm$^2$ or 100 cm$^2$ (10 cm×10 cm), or may be larger, such as 156 cm$^2$ or 225 cm$^2$ wafers now being employed.

Figure 2A:
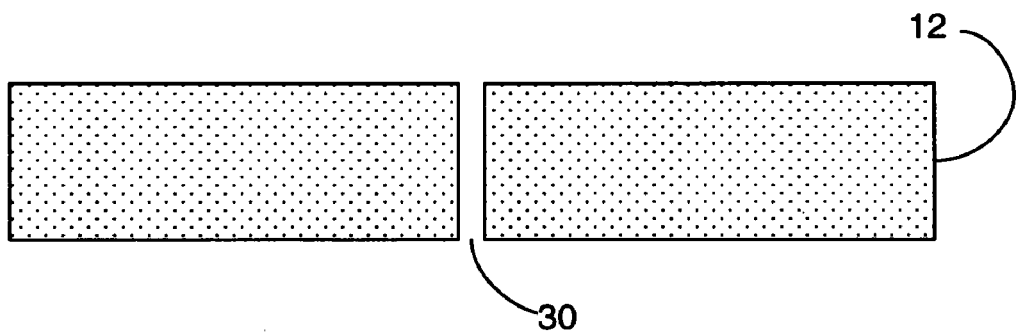
FIG. 2A is a cross-section of a silicon wafer that has been drilled and etched in a back-contact cell process sequence of the invention.
Figure 2B:
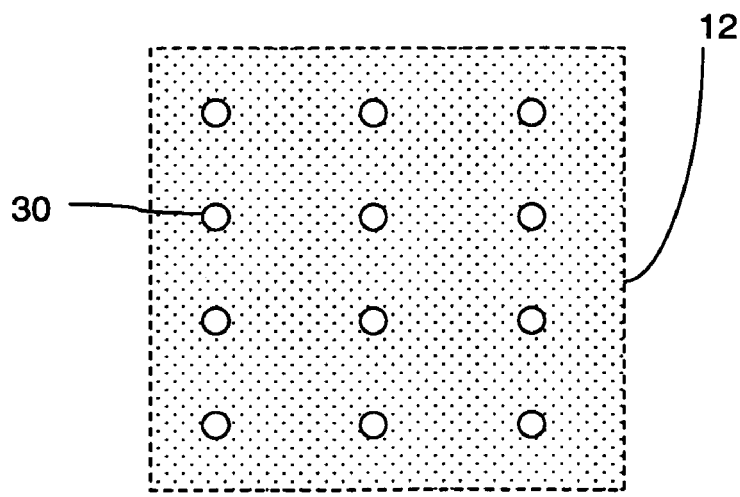
FIG. 2B is a top view of a portion of the wafer of FIG. 2A.

In the first step in each of the embodiments described below, holes 30 utilized to form conductive vias are introduced to a planar silicon wafer 12 having a front surface and a rear surface as shown in FIGS. 2A and 2B. The holes connect the front surface of the wafer to the rear surface, and are preferably formed by laser drilling, but may be formed by other processes, such as dry etching, wet etching, mechanical drilling, or water jet machining. For laser drilling, preferably a laser of sufficient power or intensity at the operating wavelength is employed such that holes can be introduced at the shortest time, such as from about 0.5 ms to about 5 ms per hole. One laser that may be employed is a Q-switched Nd:YAG laser. By the use of thinner wafers the time per hole is proportionally reduced. The diameter of the via hole may be from about 25 to 125 μm diameter, preferably from about 30 to 60 μm diameter. In one embodiment employing thin wafers, such as wafers with a thickness of 100 μm or less, the via hole diameter is approximately greater than or equal to the wafer thickness. The via hole density per surface area is dependent, in part, on the acceptable total series resistance loss due to current transport in the emitter through the holes to the rear surface. This may be determined either empirically or by theoretical calculations; by the methods of this invention the via hole density may be decreased due to decreased resistance, such as determined by Ω/sq. Typically the via hole density is one hole per 1 mm$^2$ to 2 mm$^2$ surface area, but may be a lower density, such as one hole per 2 to about 4 mm$^2$.

Following introduction of holes, such as by laser drilling, an alkaline etch step is typically and conventionally employed, in part to minimize irregularities resulting from introduction of the holes. Any conventional method may be employed, such as employing 10% by weight sodium hydroxide or potassium hydroxide at a temperature of from about 80° C. to about 90° C., which results in removal of approximately 10 μm of surface.

Use of a Phosphorus-Diffusion Source Paste

In one embodiment of the invention, printed diffusion sources are employed, preferably screen printed diffusion sources, to provide dopant for the interior of the holes. While printed diffusion sources are known, as taught in U.S. Pat. No. 4,478,879, such materials have never been employed in EWT cell structures, or employed to create a higher n-dopant concentration within and immediately adjacent the holes, thereby providing decreased series resistance. Applicants have unexpectedly found that selective application of a printed diffusion source, such as a phosphorus-diffusion source, to the area of the holes, and including the grid lines of which the holes for a part, results in substantially higher dopant concentration and decreased resistance. A representative process sequence for fabrication of a back-contact EWT cell using printed diffusion sources is shown below.

Figure 3A:
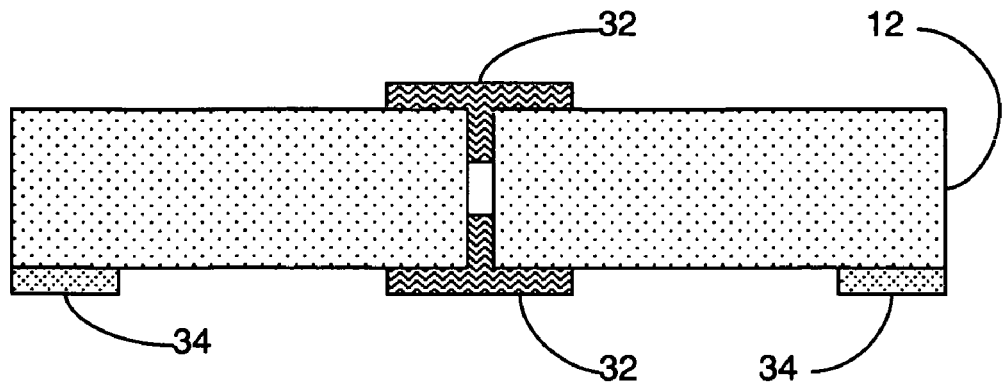
FIG. 3A is a cross-section of the wafer of FIG. 2 after the phosphorus- and boron-diffusion source pastes have been printed in a back-contact cell process sequence of the invention.

1. Laser drill
2. Alkaline etch
3. Print and dry phosphorus-diffusion source on front surface
4. Print and dry phosphorus-diffusion source on rear surface
5. Print and dry boron-diffusion source on rear surface
6. Diffuse dopants into silicon in high-temperature furnace
7. HF etch (hydrophobic both surfaces)
8. PECVD on front surface
9. PECVD on rear surface
10. Print and dry Ag paste for negative-polarity grid
11. Print and dry Ag:Al paste for positive-polarity grid
12. Fire contacts The foregoing process sequence is generally described in FIGS. 2A through 3D, which illustrate the fabrication sequence of this method and also disclose other advantages. FIG. 2A shows a cross-section view of wafer 12 after it has been drilled and etched to produce holes 30, which are steps 1 and 2 immediately above. FIG. 2B is a top view of a partial portion of wafer 12, showing a plurality of holes 30 in a spaced array. FIG. 3A is a cross-section view of wafer 12 after the phosphorus-diffusion paste 32 has been printed on the front surface and rear surface, in a pattern designed such that each row of holes 30 is covered by a line of paste 32. The boron-diffusion source paste 34 is printed on the rear surface, preferably such that interdigitated grid areas are formed between pastes 32 and 34. Thus FIG. 3A shows the resulting wafer after steps 3 through 5 immediately above. These pastes convert into diffusion-source oxides after drying and firing of the paste at high temperatures.

Figure 3B:
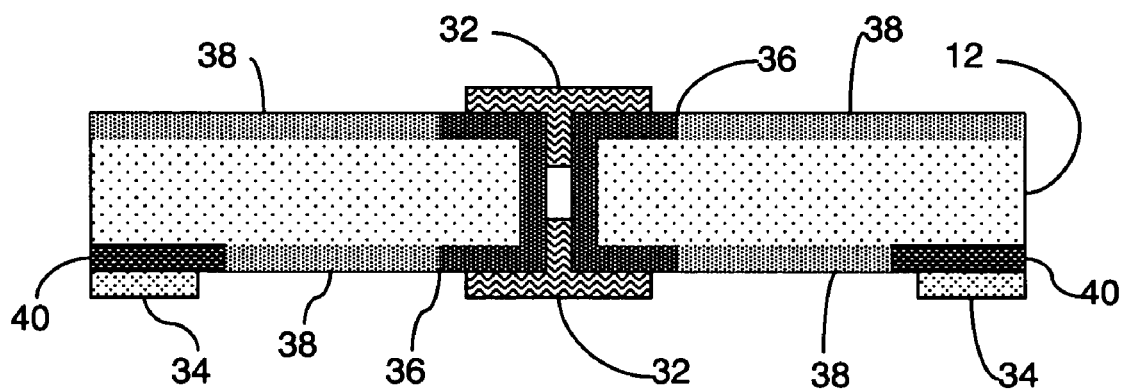
FIG. 3B is a cross-section of the wafer of FIG. 3A after dopant diffusion at high temperatures in a back-contact cell process sequence of the invention.

FIG. 3B shows the wafer after the dopant diffusion at high temperatures. Boron is diffused into the silicon beneath the boron-diffusion oxide, resulting in boron diffusion layers 40. Phosphorus is diffused into the silicon beneath the phosphorus-diffusion oxide, resulting in phosphorus diffusion layers 36. Layers 36 are heavily doped because phosphorus diffuses readily and at higher surface concentration than boron. The entire region inside hole 30 is heavily doped, even if the dopant paste 32 does not fill hole 30 completely, because the interior surfaces of hole 30 are saturated with dopant from the dopant pastes 32 on the front and rear of the hole. The heavily doped surface 36 is advantageous, because it reduces contact resistance to the grid which is subsequently applied to the rear surface, reduces electrical resistance losses for conduction through the holes 30, and reduces electrical resistance losses on the front surface for conduction to the holes 30. As further shown in FIG. 3B, light phosphorus diffusion layers 38 are produced on the exposed silicon surfaces on both the front and rear surfaces. Phosphorus for light phosphorus diffusion layers 38 comes from dopant in dopant paste 32 evaporated from the phosphorus-diffusion oxide during the high temperature diffusion. Boron also evaporates from the boron-diffusion oxide, but it has a much lower vapor pressure, and thus it is primarily phosphorus that is diffused into the exposed surfaces. The light phosphorus diffusion layers 38 are advantageous on the front surface because light phosphorus diffusion provides both the best current collection and lowest surface recombination. The light phosphorus diffusion layers 38 are also advantageous on the rear surface because the phosphorus passivates the rear surface, and further makes it less likely to cause electrical shunts where the phosphorus layer 38 contacts the boron diffusion layers 40. Hence, this process sequence produces a cell structure with a high efficiency potential.

Following dopant diffusion at high temperatures, an etch step (HF etch) using an aqueous solution of hydrofluoric (HF) acid is typically employed. Any suitable acid etch may be employed, such as 10% HF acid. Any conventional method of applying the etchant may be employed, including dipping the wafer in a solution containing HF acid. Sufficient HF acid is applied for a period such that the front and rear surfaces are rendered hydrophobic, which may easily be ascertained from the "sheeting" effect of the aqueous HF acid solution when a wafer is removed from solution.

The bare silicon surface resulting from the HF etch may require passivation by deposition of a dielectric layer. A silicon nitride (SiN) layer deposited by plasma-enhanced chemical vapor deposition (PECVD) is a well-known technique for passivating silicon surfaces in solar cell fabrication. Alternatively, a layer of $SiO_2$ may be thermally grown or other dielectric materials, such as $SiO_2$, $TiO_2$, $Ta_2O_5$, and so on, may be deposited by various means, such as printing, spraying-on, or chemical vapor deposition, for surface passivation.

In general, as discussed below the diffusion-barrier oxide does not need to be completely removed if it has the following properties: a good interface with low recombination with the silicon, and Ag:Al or other p-type contacts can be fired through the material and make low resistance contact to the p-type silicon substrate, in one embodiment by employing a glass frit in screen printed contact material. Leaving the diffusion-barrier oxide in place allows elimination of at least one processing step, PECVD deposition on rear surface.

Following passivation, the negative-polarity grid contacts and the positive-polarity grid contacts are applied. Any conventional method of grid metal application may be employed, such as screen-printing an Ag paste for the negative-polarity grid and an Ag:Al paste for the positive-polarity grid. The paste may be made by a combination of a particle form of Ag or Ag:Al, as appropriate, in a liquid formulation which may further include binders, solvents, and so on known and used in the art to make a screen printable paste. It is also possible and desirable to use a paste formulation containing components which dissolve the nitride (see M. Hilali, et al., "Optimization of self-doping Ag paste firing to achieve high fill factors on screen-printed silicon solar cells with a 100 ohm/sq. emitter," $29^{th}$ IEEE Photovoltaic Specialists Conf., New Orleans, La., May 2002, incorporated here by reference), such as a glass frit. The wafer is then fired to metallize the grid contacts.

Figure 3C:
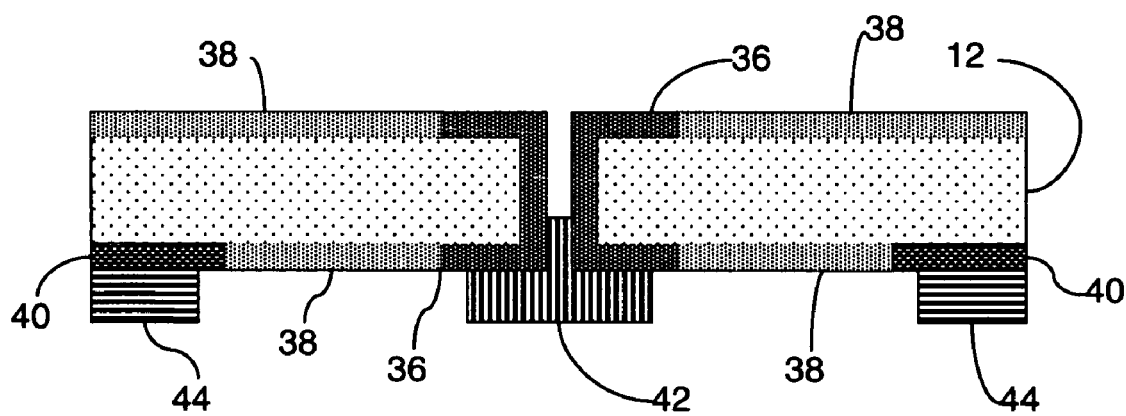
FIG. 3C is a cross-section of a completed silicon wafer of FIGS. 3A and 3B made in a back-contact cell process sequence of the invention using printed diffusion sources.

FIG. 3C shows the completed solar cell, after application of Ag paste for the negative-polarity grid and Ag:Al paste for the positive-polarity grid, resulting after firing in Ag negative-polarity grid contacts 42 and Ag:Al positive-polarity grid contacts 44. The PECVD silicon nitride layers, which may optionally be applied, are not shown for clarity. Note that in all the drawings, both here and elsewhere in the application, the dimensions of the holes and silicon substrate, spacing and relative sizes of various component structures, thicknesses of the various layers, and other dimensions are not drawn to scale, but rather are shown schematically for purposes of illustration and easy identification.

Figure 3D:
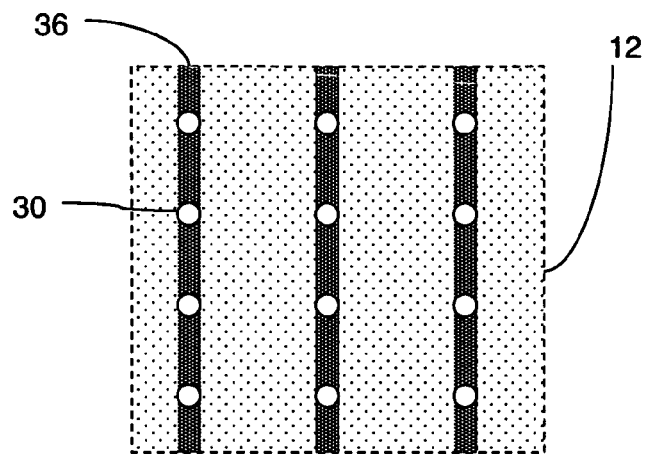
FIG. 3D is a top view showing the phosphorus-diffusion grid patterns.

As shown in FIG. 3D, in one embodiment the result of screen printing the diffusion source, and particularly the phosphorus-diffusion source, is that a desired pattern 36 results incorporating the via holes 30 and further providing increased dopant concentration and corresponding decreased resistance along, for example, the negative-polarity grid. Pattern 36 is optionally and preferably present on the front surface and rear surface resulting from application of dopant paste 32 on both the front and rear surface. On the rear surface, the pattern 36 is subsequently partially covered by metallized grid contacts 44; however, there is no such covering on the front surface. It is also possible, such as on the front surface, to provide increased dopant concentration grids in both the x-axis and y-axis, resulting from the pattern of screen printing a phosphorus-diffusion source, such that a via is present at the intersection of each x-axis grid line with each y-axis grid line, thereby providing for enhanced collection.

It is also possible to provide a light $n^+$ dopant diffusion using a gaseous source, for example, phosphorus oxychloride ($POCl_3$) and subsequent oxidation to drive in and provide surface passivation on the front and rear surfaces. Preferably this process step is employed prior to the HF etch step to remove the printed diffusion source oxides. In yet another related embodiment, a gas diffusion $POCl_3$ step is employed as described, and the step of printing a phosphorus-diffusion source on the front surface is omitted. In each such embodiment, the resulting phosphorus doping within the structure of the hole is still significantly higher than the average or mean phosphorus doping on either the front or rear surfaces.

Similar process sequences can be used for fabrication of other back-contact cell structures. In this embodiment, the PECVD deposition, particularly on the rear surface, is not required if the diffusion-source oxides have a low-recombination interface with the silicon substrate, and if the Ag and Ag:Al contacts can be fired through the oxide with low contact resistance, such as by employing fritted Ag paste and fritted Ag:Al paste.

Use of Printed Diffusion Barriers and Dopant Diffusion Barriers

In another embodiment of the invention, a printed diffusion barrier, to prevent or limit diffusion of $n^+$ dopants such as a gaseous phosphorus dopant applied by use of $POCl_3$, is employed. Preferably the printed diffusion barrier also provides a source of $p^+$ dopant, such as boron. Directly printing a diffusion barrier permits simple and direct application of patterning steps. Materials suitable for use as diffusion barriers are available; for example, Ferro Corporation (Cleveland, Ohio) offers pastes for screen printing of $TiO_2$ for antireflection layers, tantalum oxide-based material as a phosphorus diffusion barrier, and borosilicate glass for a boron diffusion source. All these materials provide good barriers during phosphorus diffusion, though use of certain materials, such as printed borosilicate glass, have not previously been described as providing a phosphorus diffusion barrier The borosilicate glass composition offers the additional benefit of providing boron diffusion beneath the barrier material to help passivate the surface and reduce contact resistance for the positive polarity contact. The diffusion barrier material is applied in the desired pattern, such as by screen printing, although alternative methods of application may be employed, such as ink jet printing, masking or stenciling, provided that such methods result in patterned diffusion barrier material.

In this embodiment and the embodiments following, the $n^+$ dopant diffusion is preferably performed using a gaseous source, for example, $POCl_3$ for phosphorus diffusions. Other diffusion sources, such as solid source or spray-on diffusion sources, can alternatively be employed. The oxide from the phosphorus diffusion is generally removed with HF acid because it can cause reliability problems for encapsulated photovoltaic modules. Hence, the preferred sequence strips the phosphorus oxide from the phosphorus diffusion and the diffusion-barrier oxide with HF acid etch. The bare silicon surface may require passivation by deposition of a dielectric layer. SiN deposited by PECVD is a well-known technique for passivating silicon surfaces in solar cell fabrication. Alternatively, a layer of $SiO_2$ may be thermally grown or other dielectric materials, such as $SiO_2$, $TiO_2$, $Ta_2O_5$, and so on, may be deposited by various means, such as, for example, printing, spraying-on, chemical vapor deposition, for surface passivation.

In general, as discussed below the diffusion-barrier oxide does not need to be completely removed if it has the following properties: a good interface with low recombination with the silicon, and Ag:Al or other p-type contacts can be fired through the material and make low resistance contact to the p-type silicon substrate, in one embodiment by employing a glass frit in screen printed contact material. Leaving the diffusion-barrier oxide in place allows elimination of at least one processing step, PECVD deposition on rear surface.

One representative process sequence for fabrication of a back-contact EWT cell using a printed diffusion barrier is shown below. The sequence provides for removal of the diffusion-barrier oxide (the "HF etch, hydrophobic both surfaces" step as discussed above), and replaces the diffusion-barrier oxide with an applied surface passivation step, such as a PECVD SiN layer for surface passivation. However, here too the diffusion barrier oxide need not be completely removed and replaced with the PECVD SiN if the diffusion barrier oxide has good interface with the silicon, thereby resulting in elimination of one processing step.

Figure 4A:
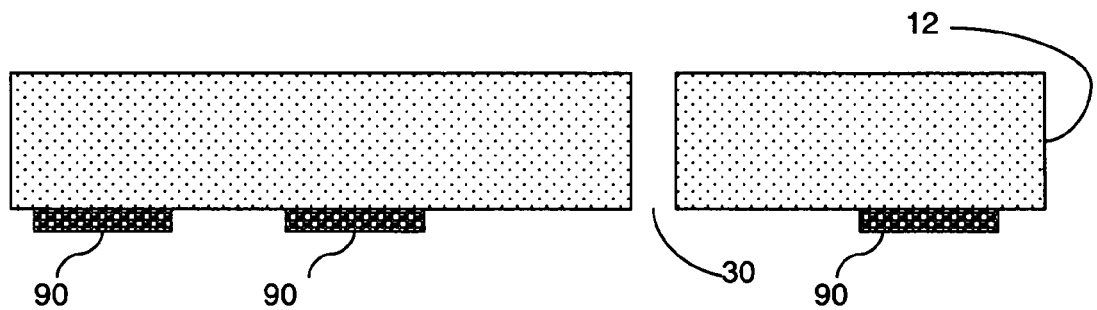
FIGS. 4A to 4N are cross-sections showing steps of a fabrication sequence of the invention for making a back-contact EWT cell using a printed diffusion barrier.
Figure 4B:
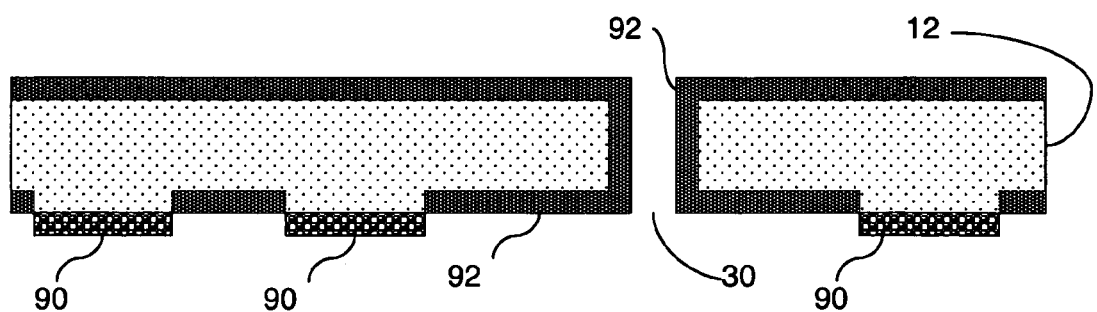

1. Laser drill
2. Alkaline etch
3. Print diffusion barrier
4. Dry and fire
5. Etch and clean wafer
6. $POCl_3$ (30 to 60 Ω/sq)
7. HF etch (hydrophobic both surfaces)
8. PECVD nitride on front surface
9. PECVD nitride on rear surface
10. Print Ag for negative-polarity grid
11. Print Ag:Al or Al for positive-polarity grid
12. Fire contacts Alternative embodiments of the method are possible and contemplated. In one preferred alternative embodiment, FIG. 4A depicts wafer 12 with diffusion barriers 90, such as a $TiO_2$ paste, applied such that the space between immediately adjacent paired diffusion barriers 90 will be utilized as the positive-polarity grid in a subsequent step. Thus processing steps 1 through 4 above are followed to result in the device of FIG. 4A. However, thereafter a phosphorus diffusion step, such as using $POCl_3$ (30 to 60 Ω/sq), is employed, resulting in the device of FIG. 4B with $n^+$ diffusion layers 92. Alternatively, other $n^+$ dopants may be employed. An etch step is then employed, to etch the phosphorus glass formed during $POCl_3$ diffusion, with the diffusion barriers 90 remaining in place. SiN is then conventionally deposited by PECVD, or alternatively by other methods and materials for passivation. Following SiN deposition on both sides (not shown), a negative contact Ag grid is screen printed and a positive contact Ag:Al grid, or more preferably an Al grid, is screen printed, and the wafer fired. The result, as shown in FIG. 4C, is a cell with diffusion barriers 90, positive screen printed Ag:Al or Al grid substrate 96, and negative screen printed Ag grid substrate 98.

Figure 4C:
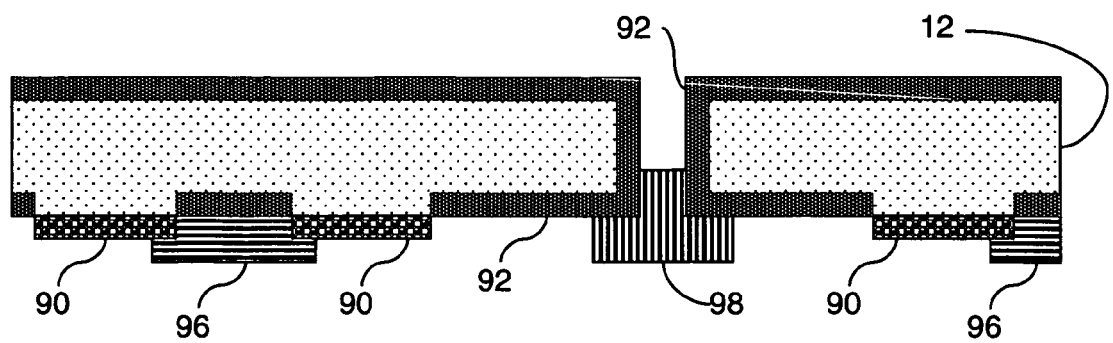
Figure 4D:
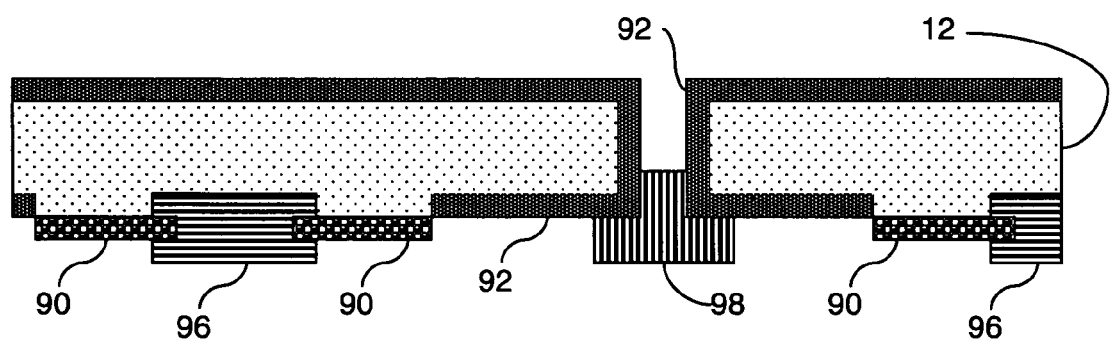

As shown in FIG. 4C, the screen printed positive grid substrate 96 may partially overlap a portion of diffusion barriers 90, or alternatively (not shown) may be disposed wholly between the side edges of diffusion barriers 90. The screen printed Al (which may be an Al alloy, such as Ag:Al, or may be substantially Al), is applied to an existing n-type diffusion layer, as shown in FIG. 4C. However, on firing the Al-based metallization forms a $p^+$ layer in place of the existing $n^+$ diffusion layer. A frit may be included in positive screen printed Ag:Al or Al grid substrate 96. Thus the $n^+$ region underneath the p-type contact is successfully over-doped; that is, a spiking contact through the $n^+$ region is made with the p-type substrate. In another variant, the Al-dopant metal is fired at a temperature above the Ag—Si eutectic temperature so that the contact is alloyed with the silicon. Thus as shown in FIG. 4D, upon firing the $n^+$ diffusion layers 92 immediately adjacent the positive screen printed Ag:Al or Al grid substrate 96 are over-doped by the Al in the grid substrate, resulting in contacts 96.

Figure 4E:
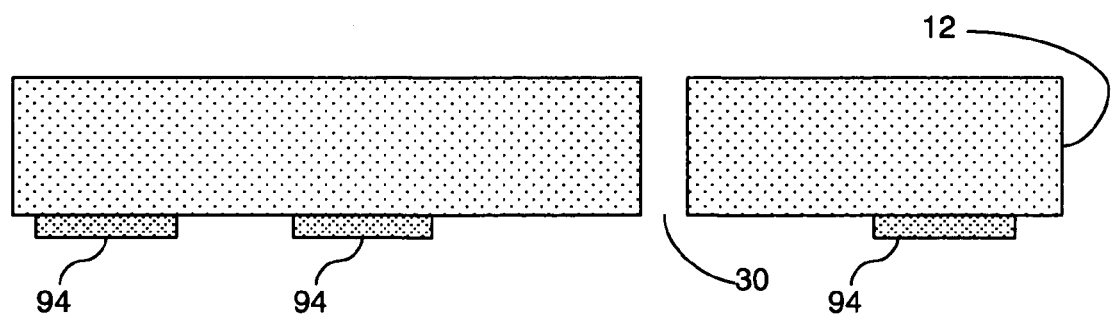
Figure 4F:
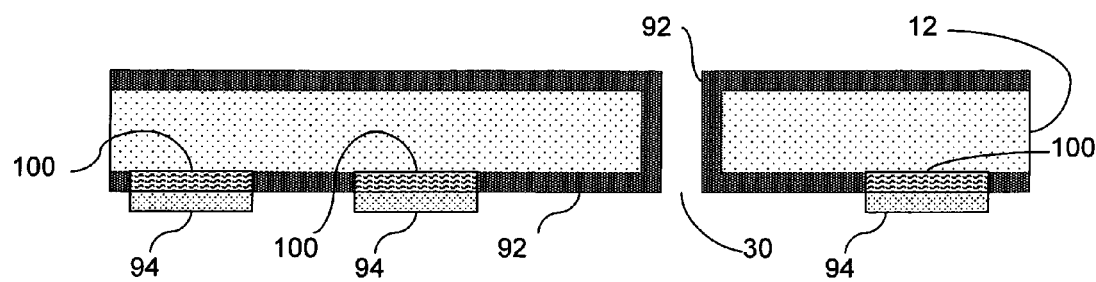
Figure 4G:
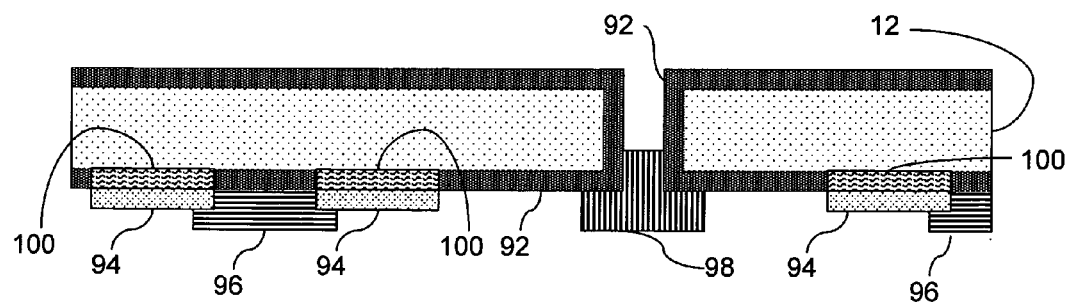
Figure 4H:
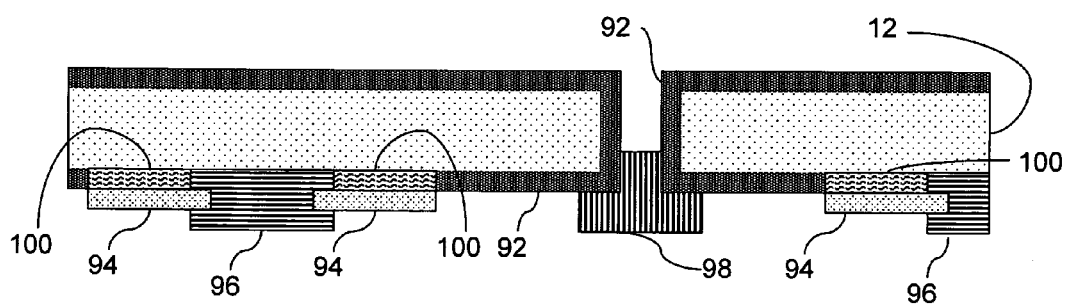

In yet another particularly preferred embodiment, the diffusion barrier comprises a source of $p^+$ dopant, preferably boron. Thus as shown in FIG. 4E screen printed boron diffusion barriers 94 are provided, such as a $TiO_2$ paste containing a boron compound, such as in one embodiment a boron oxide species. The paste for boron diffusion barrier 94 is formulated such that a light boron diffusion results, as hereafter described. Other p-type acceptors may alternatively be employed to form a diffusion barrier including a doped dielectric paste, including but not limited to aluminum, gallium or indium, most preferably oxide compounds of one or more of the foregoing. In one embodiment, the diffusion paste provides more than one p+ dopant, preferably in an oxide form. Alternatively the boron or other p-dopant barrier can be sprayed, ink jet printed, or applied by means other than screen printing. When phosphorus is diffused into the silicon to create an $n^+$ doped region, the p-type acceptor in the dielectric preferably diffuses into the substrate at the same time, creating a p-type region while saving a processing step. Thus following screen printing and cure of boron diffusion barrier 94, a phosphorus diffusion step, such as using $POCl_3$ (30 to 60 Ω/sq), is employed, resulting in the co-diffusion of boron and phosphorus. As shown in FIG. 4F, the resulting structure include $n^+$ diffusion layers 92, preferably diffused to approximately 30–50 Ω/sq in one example, and $p^+$ diffusion layers 100, preferably diffused to approximately 100 to 500 Ω/sq in the same example. An etch step is then employed, to etch the phosphorus glass formed during $POCl_3$ diffusion, with the boron diffusion barriers 94 remaining in place. SIN is then conventionally deposited by PECVD, or alternatively other methods of surface passivation are employed. Following SiN deposition on both sides (not shown), a negative contact Ag grid is screen printed and a positive contact Ag:Al grid, or more preferably an Al grid, is screen printed, and the wafer fired. The result, as shown in FIG. 4G, is a cell with boron diffusion barriers 94, positive screen printed Ag:Al or Al grid substrate 96, and negative screen printed Ag grid substrate 98. As shown in FIG. 4G, the screen printed positive grid substrate 96 may partially overlap a portion of boron diffusion barriers 94, or alternatively (not shown) may be disposed wholly between the side edges of boron diffusion barriers 94. The screen printed Al (which may be an Al alloy, such as Ag:Al, or may be substantially Al), is applied to an existing n-type diffusion layer, as shown in FIG. 4G. However, on firing the Al-based metallization forms a $p^+$ layer in place of the existing $n^+$ diffusion layer. A frit may be included in positive screen printed Ag:Al or Al grid substrate 96. Thus the n$^+$ region underneath the p-type contact is successfully over-doped; that is, a spiking contact through the n$^{30}$ region is made with the p-type substrate. In another variant, the Al-dopant metal is fired at a temperature above the Ag-Si eutectic temperature so that the contact is alloyed with the silicon. Thus as shown in FIG. 4H, upon firing the n$^+$ diffusion layers 92 immediately adjacent the positive screen printed Ag:Al or Al grid substrate 96 are over-doped by the Al in the grid substrate, resulting in contacts 96 adjacent to and in contact with p$^+$ diffusion layers 100.

Figure 4I:
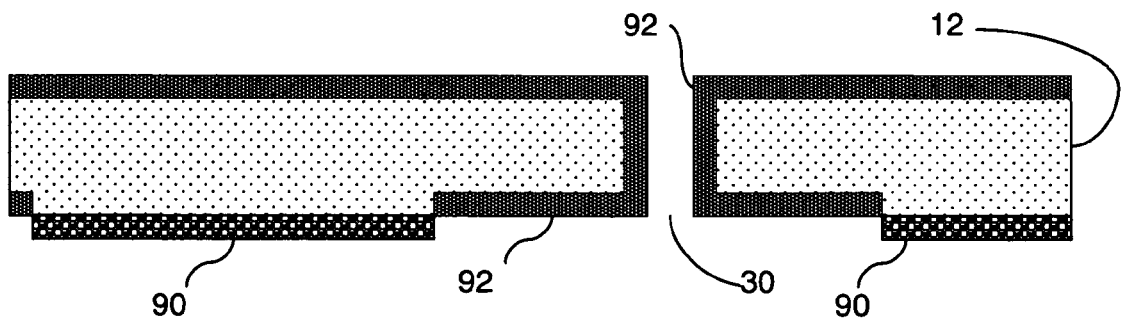
Figure 4J:
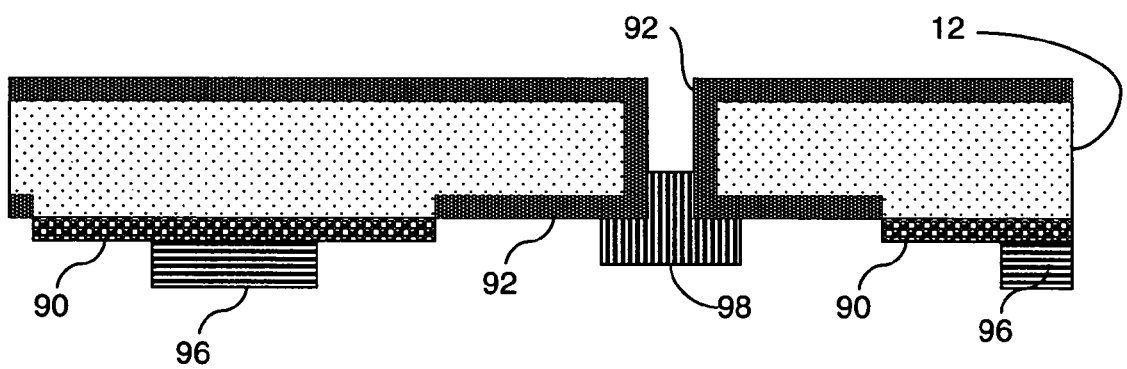
Figure 4K:
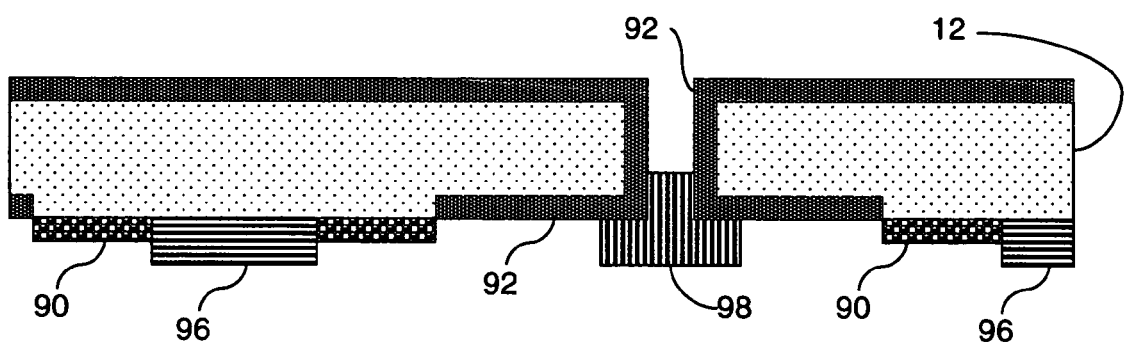

In yet another preferred embodiment, as shown in FIG. 4I a diffusion barrier 90 is applied, followed by an n$^+$ diffusion step, such as phosphorus diffusion using POCl$_3$ (30 to 60 Ω/sq), resulting in n$^+$ diffusion layers 92, also as shown in FIG. 4I. Following SiN deposition on both sides (not shown), a negative contact Ag grid is screen printed and a positive contact Ag:Al grid, or more preferably an Al grid, is screen printed. The result, as shown in FIG. 4J, is a cell with diffusion barriers 90, positive screen printed Ag:Al or Al grid substrate 96, which contains a frit or other substance to drive the substrate 96 through barrier 90, and negative screen printed Ag grid substrate 98. The screen printed Al (which may be an Al alloy, such as Ag:Al, or may be substantially Al), is applied directly to an the diffusion barrier 90, as shown in FIG. 4J. However, on firing the Al-based metallization drives through the barrier 90, as shown in FIG. 4K, with the Al forming a p$^+$ layer thereunder (not shown).

Figure 4L:
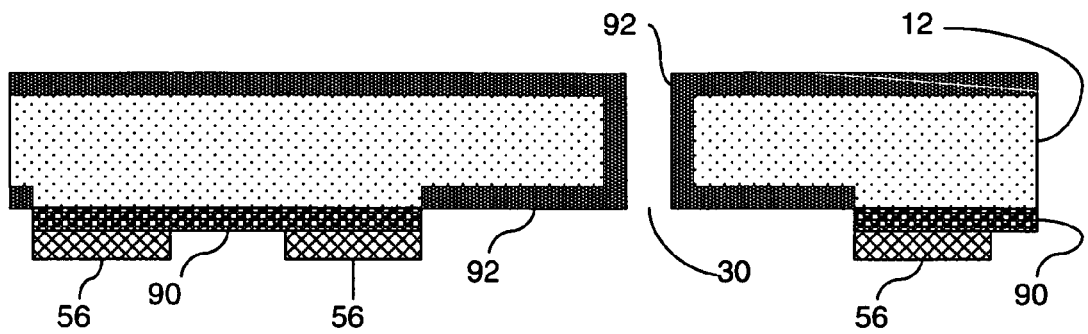
Figure 4M:
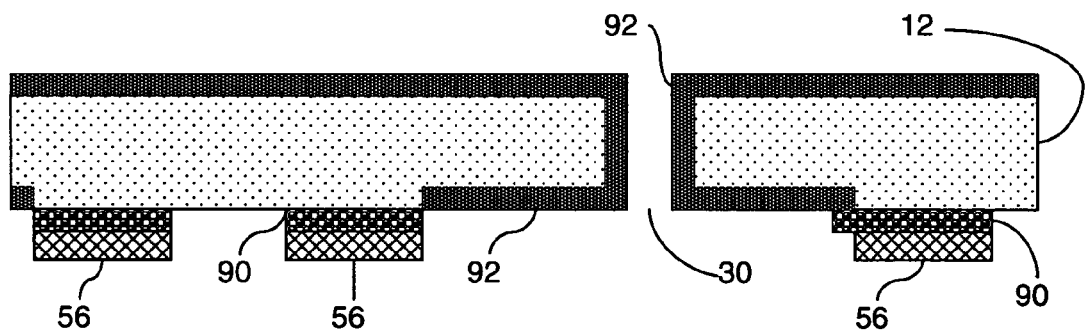
Figure 4N:
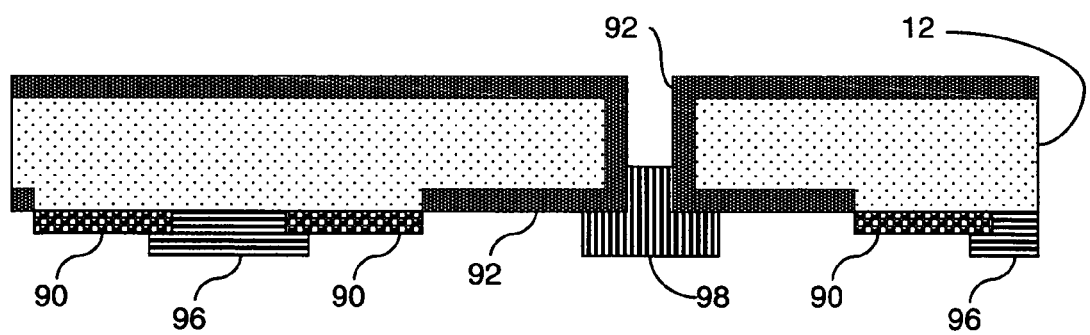

In a related preferred embodiment, as shown in FIG. 4L, a diffusion barrier 90 is applied, followed by an n$^+$ diffusion step, such as phosphorus diffusion using POCl$_3$ (30 to 60 Ω/sq), resulting in n$^+$ diffusion layers 92, followed by application of a patterned resist 56. Following application of the resist 56 and SiN deposition on both sides (not shown), an etch step is employed to etch and remove the exposed portion of diffusion barrier 90, as shown in FIG. 4M. Following etch removal of the diffusion barrier 90, the resist 56 is removed and the wafer is cleaned. A negative contact Ag grid 98 is screen printed and a positive contact Ag:Al grid 96, or more preferably an Al grid 96, is screen printed. The result, as shown in FIG. 4N, is a cell with diffusion barriers 90, positive screen printed Ag:Al or Al grid substrate 96, and negative screen printed Ag grid substrate 98. The screen printed Al (which may be an Al alloy, such as Ag:Al, or may be substantially Al), is applied to the patterned portion of diffusion barrier 90 removed by the resist and etch step, as shown in FIG. 4M. Thus on firing the Al-based metallization makes direct contact with silicon 12, as shown in FIG. 4N, with the Al forming a p$^+$ layer thereunder (not shown).

In yet another related and alternative embodiment, the process sequence can be employed to produce patterned diffusions by using different printed diffusion sources as the diffusion barrier. As discussed herein, different pastes are available, for example from Ferro Corporation, for performing either boron or phosphorus diffusions, and may be formulated to act as diffusion barriers. Thus while the embodiment described above employs p-type silicon wafers with a boron doped diffusion barrier, other embodiments are possible and contemplated.

It is also possible to include, for example, an n$^+$ diffusion paste, preferably which does not include a diffusion barrier component, for use in forming a higher n$^{++}$ region, preferably a grid including the holes 30. These pastes can be applied by screen printing. Following application, the pastes are dried to remove organics and volatile materials, and fired at a high temperature to diffuse the dopant into the silicon. The pastes generally contain oxides of the dopant elements; the oxides can be removed after the dopant diffusion by HF acid etch.

This process may optionally be modified to produce a selective emitter structure in the solar cell. For this embodiment, the holes and rear surface are preferably more heavily doped for low resistance, while the front surface is more lightly doped, providing higher current and voltage. In the above process, step 6 would be replaced by a lighter POCl$_3$ diffusion (preferably 80 to 100 Ω/sq). After step 9, a second, heavy POCl$_3$ diffusion (preferably less than approximately 20 Ω/sq), would be performed, preferably followed by an HF etch to remove phosphorus diffusion glass and some nitride to form an anti-reflection coating on the front surface. This variant works best when the nitride is at most only slightly deposited within the holes, and preferably not present there at all; thus use of an anisotropic PECVD process is preferred.

Use of Spin-On Glass Diffusion Barrier

In another embodiment, a back-contact cell process sequence employs deposition of spin-on glass (SOG) and screen-printed resist patterning. The SOG is used as a barrier during the emitter diffusion step ("diffusion barrier oxide"). The SOG is deposited by conventional means, such as by spinning or spraying, and is preferably dried and densified in a furnace. Preferably the SOG is also employed to deposit any of a variety of dielectric materials. Thus the SOG may be silica (SiO$_2$), borosilicate glass (BSG), BSG mixed with other p-type dopant oxides (Ga, Al, In, etc.), phosphosilicate glass (PSG), titania (TiO$_2$), and so on. SOGs of this type are known in the industry, and Filmtronics (Butler, Pa.) offers a variety of such materials. The SiO$_2$ film is particularly advantageous because SiO$_2$ forms an excellent low-recombination interface with the silicon wafer. The borosilicate and phosphosilicate glasses have the added advantage of acting as a dopant source of boron or phosphorus, respectively. The lightly doped junction beneath the densified BSG or PSG layer helps improve cell performance and passivate the surface. SOGs have the additional advantage of being relatively non-toxic and simple to process. Prior art methods, as disclosed in U.S. Pat. No. 5,053,083, have employed compounds such as phosphine and silane or diborane and silane, compounds which are toxic and require specialized handling and processing equipment.

The SOG is patterned by first printing an etch resist, and then performing a chemical etch. The printing is preferably done with a screen printer, but other printing methods, such as ink jet, stencil, offset printing and the like, can also be employed. Any of a variety of materials can be used for the etch resist. The only requirements for the resist are that it be printable and that it resists the chemical etchant solution. Aqueous solutions using HF acid are widely known for etching of oxide materials.

A representative process sequence is described below for fabrication of a back-contact EWT solar cell using SOG as a diffusion barrier. A similar process sequence can be used for other back-contact cell structures, such as MWA, MWT, or back-junction solar cells. The screen-printed Ag grids for the negative and positive polarity contacts are preferably fired through the silicon nitride to make contact to the silicon, which is well known in the art.

In the process sequence for forming back-contact EWT solar cells using SOG patterned with screen-printed resist, a p-type silicon semiconductor substrate is provided. The silicon substrate is typically multicrystalline or polycrystalline silicon, but other types of silicon substrates may be employed, including but not limited to single crystal silicon.

The first and second steps, laser drilling holes and etching, are as described above. In the third step, SOG is applied. As discussed above, the SOG serves both as a barrier during the emitter diffusion step and optionally and preferably to deposit dielectric materials. The SOG is deposited by conventional means, such as by spinning or spraying, or by alternative means such as dipping in a solution including the SOG material, and is then dried and densified in a furnace. Preferably the SOG is $SiO_2$, BSG, BSG mixed with additional p-type dopant oxides, PSG, or $TiO_2$. Typically, the SOG is applied to the rear surface, and after furnace densification results in a thickness of about 0.1 to 1 µm.

After densification of the SOG, a resist is printed, such as by screen printing, but alternative methods of introducing a patterned resist can be employed. The resist pattern provides a pattern for at least one set of contact grids, typically interdigitated contact grids in patterns well known in the art, such as here for a positive-polarity grid. Any suitable resist material may be employed; however, it is important to note that a photoresist material is not employed, but rather a chemical resistant resist material, and specifically an acid resistant material, such that the SOG is not removed from the patterned area when the wafer is subjected to acid etch treatment.

Following printing and drying of the resist, the wafer is etched to remove the SOG other than from areas covered with the resist. Any suitable acid etch may be employed, provided that the resist is not removed by the chemical etchant solution. In one preferred embodiment, an aqueous solution of HF acid, such as 10% HF acid, is employed. Any conventional method of applying the etchant may be employed, including dipping the wafer in a solution containing HF acid. The SOG is removed from the interior of the holes during this step, as well as from planar front and rear surfaces not covered with the resist.

Following the etch step, the resist is stripped and the wafer cleaned. The chemical solution or other method employed to remove the resist depends on the resist that was used. The wafer can also be further cleaned, using suitable chemical cleaning solutions, for example comprising hydrogen peroxide and sulfuric acid. The result is a patterned wafer, wherein the SOG is present only in the areas where the resist had been applied.

A comparatively heavy phosphorus diffusion is applied by conventional means, including preferably gas phase diffusion using liquid $POCl_3$, to result in 40 to 60 Ω/sq surface resistivity. However, other diffusions sources or methods may be used, including application of liquid sources conventional methods such as coating, dipping or spin-on application, or solid sources, such as with a heating of a solid source material, such as $P_2O_5$, to high temperatures. In general, conventional gaseous $POCl_3$ diffusion is preferred.

Following phosphorus diffusion, the wafer is again chemically etched, such as by using HF acid. Sufficient HF acid is applied for a period such that the front and rear surfaces are rendered hydrophobic, which may easily be ascertained from the "sheeting" effect of the aqueous HF acid solution when a wafer is removed from solution.

Following the second etch step, the bare silicon surface on the front side and the rear side is preferably, but optionally, passivated by deposition of a dielectric layer. SiN may be conventionally deposited by PECVD, or alternatively other methods and materials for passivation may be employed. As discussed herein, if the rear surface diffusion-barrier oxide is not removed such as by chemical etching, which is feasible under certain conditions as discussed above, then passivation of the rear surface may be omitted.

Following passivation, the negative-polarity grid contacts and the positive-polarity grid contacts are applied. Any conventional method of grid metal application may be employed, such as screen-printing an Ag paste for the negative-polarity grid and an Ag:Al paste for the positive-polarity grid. The paste may be made by a combination of a particle form of Ag or Ag:Al, as appropriate, in a liquid formulation which may further include binders, solvents, and so on known and used in the art to make a screen printable paste. It is also possible and desirable to use a paste formulation containing components which dissolve the nitride (see M. Hilali, supra), such as a glass frit. The wafer is then fired to metallize the grid contacts.

Figure 5A:
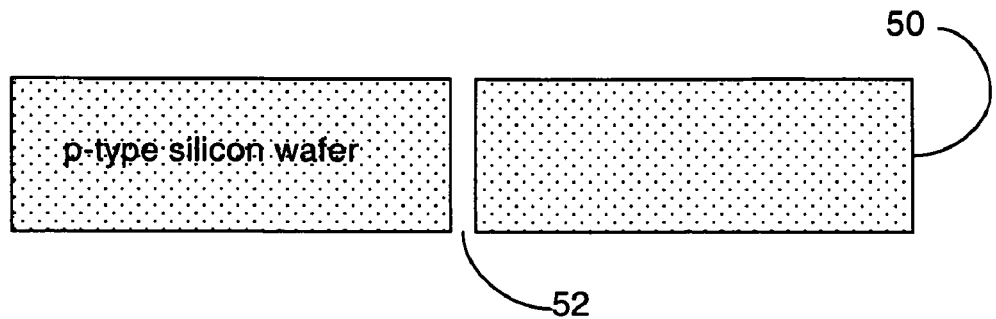
FIGS. 5A to 5G are cross-sections showing steps of a fabrication sequence of the invention for making a back-contact EWT cell using a SOG application.
Figure 5B:
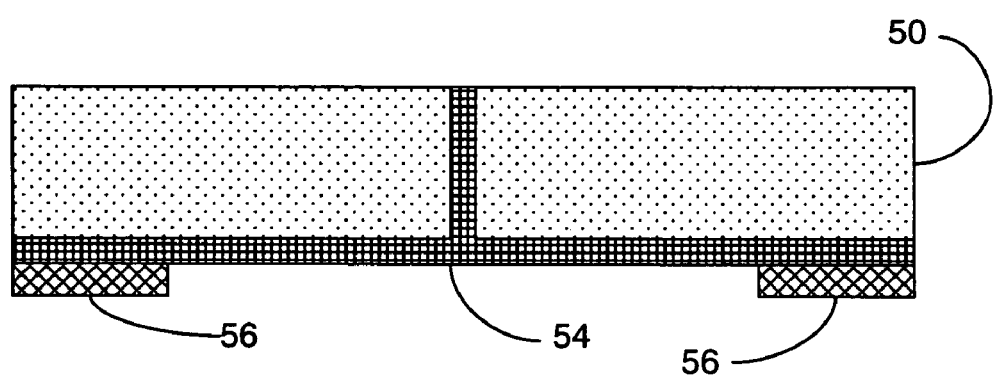
Figure 5C:
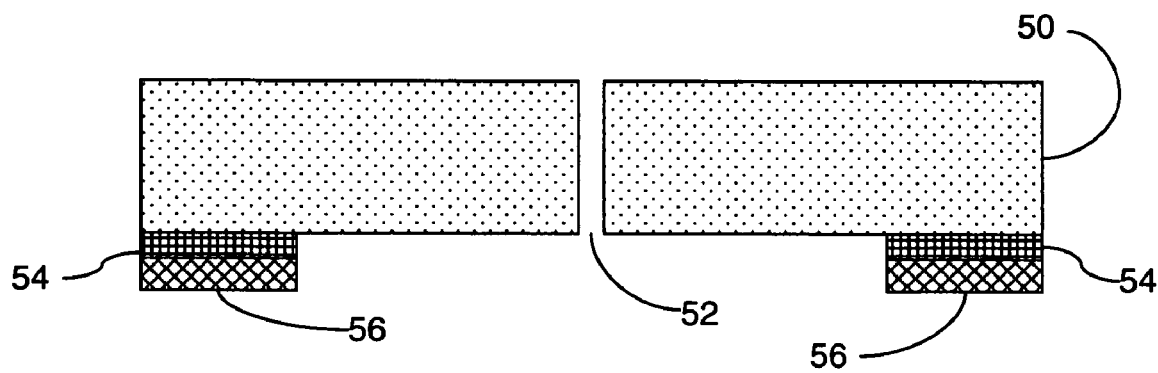
Figure 5D:
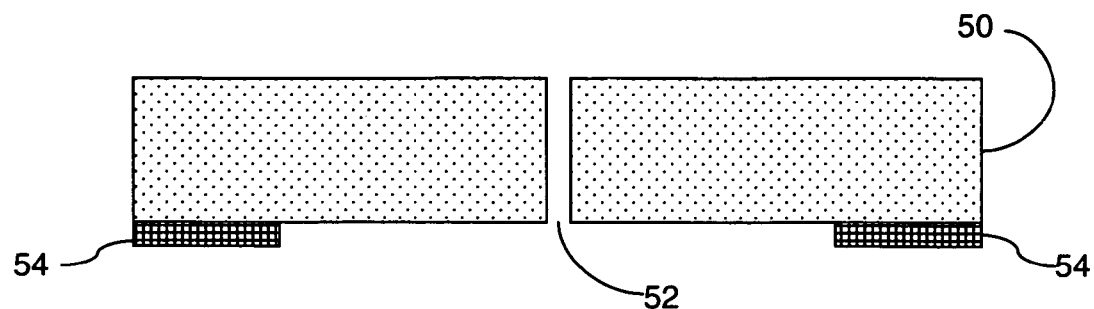
Figure 5E:
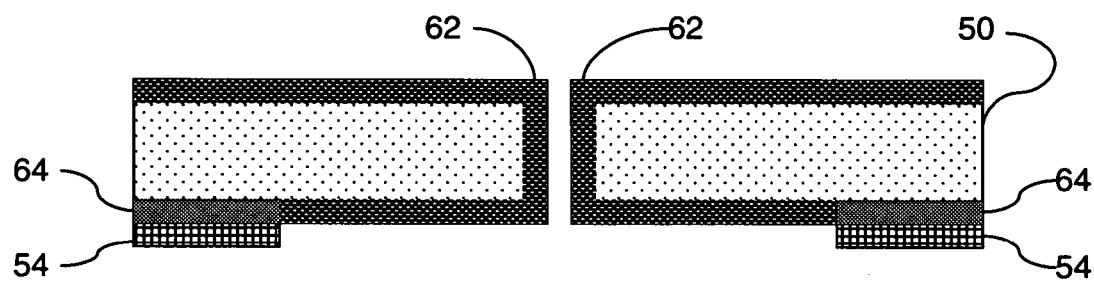
Figure 5F:
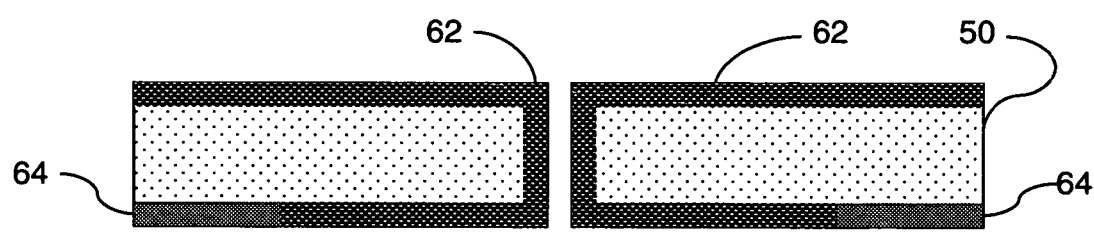
Figure 5G:
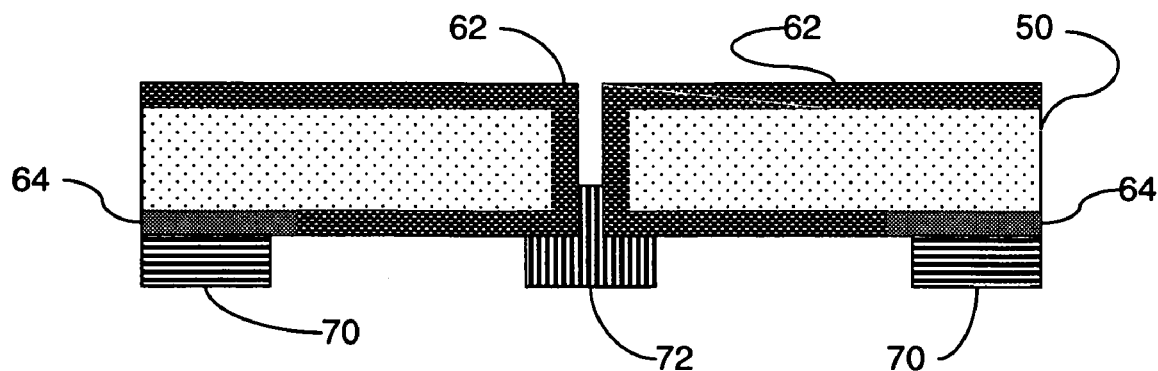

It may thus be seen that this method may be summarized as follows, it being understood that certain steps may be performed in an order other than that given, and still result in the desired product:
 1. Laser drill holes
 2. Alkaline etch wafer
 3. Apply SOG
 4. Densify SOG
 5. Print resist
 6. Etch SOG
 7. Strip resist and clean wafer
 8. $POCl_3$ diffusion (40 to 60 Ω/sq)
 9. HF etch, hydrophobic both surfaces
 10. PECVD nitride on front surface
 11. PECVD nitride on rear surface
 12. Print Ag for negative-polarity grid
 13. Print Ag:Al for positive-polarity grid
 14. Fire contacts As shown in FIG. 5A, holes 52 are laser drilled and alkaline etched in a silicon substrate, preferably p-type silicon wafer 50. A p-type SOG 54 is then applied to the rear surface as shown in FIG. 5B, such as BSG or BSG or another SOG mixed with other p-type dopant oxides, such as Ga, In or Al. A printed etch resist 56 is then applied in a pattern corresponding to the desired grid. Following an etch step, such as HF acid etch, a p-type pattern SOG 54 results, as shown in FIG. 5C. The p-type SOG in hole 52 is also removed during the etch step, such that the remaining structure consists solely of patterned p-type SOG 54 which is covered by resist 56. As shown in FIG. 5D, the resist is then removed, such that only patterned p-type SOG 54 remains on wafer 50. A heavy $POCl_3$ diffusion (40 to 60 Ω/sq) is then performed, resulting in n-type diffusion layers 62 and p-type diffusion in layers 64 as shown in FIG. 5E. FIG. 5F shows the water after the HF acid etch step and removal of the dopant SOG glasses 54. FIG. 5G shows the completed solar cell, after application of Ag paste for the negative-polarity grid and Ag:Al paste for the positive-polarity grid, resulting after firing in Ag negative-polarity grid contacts 72 and Ag:Al positive-polarity grid contacts 70. The PECVD silicon nitride layers, which may optionally be applied, are not shown for clarity.

In an alternative embodiment, the SOG material is applied in the desired pattern, such as ink jet printing, offset printing, or by suitable masking or stenciling, resulting in patterned SOG material. By use of this method, it is possible to eliminate the resist print and associated etch and strip steps, resulting in considerable reduction in complexity of the process steps.

Use of Spin-On Glasses as Diffusion Barrier and Dopant Sources

In yet another embodiment, the invention provides alternative methods employing use of a printed SOG material or of SOG applied by spin-on or spray-on techniques, for fabrication of a back-contact EWT cell. The process similarly starts with application and patterning of a SOG to define the p-type contact region on the rear surface. The densified SOG contains borosilicate glass, or other inorganic compounds that provide p-type dopants, so that there will be a p-type diffusion in the p-type contact region. Alternatively, this process can start with the printing and firing of a borosilicate glass paste. A SOG containing an n-type dopant (generally phosphosilicate glass) is applied on the rear surface and over the previous pattern. A single high-temperature furnace step simultaneously diffuses the phosphorus and boron into the rear surface in the desired pattern.

Figure 6A:
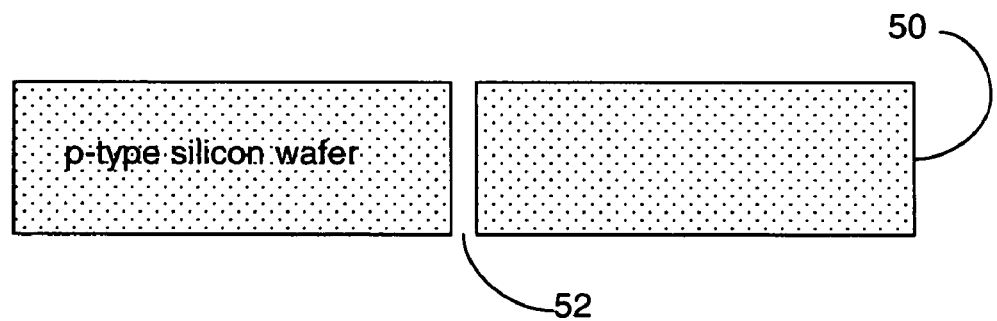
FIGS. 6A–6H are cross-sections showing steps of a fabrication sequence of the invention for making a back-contact EWT cell using multiple SOG applications.
Figure 6B:
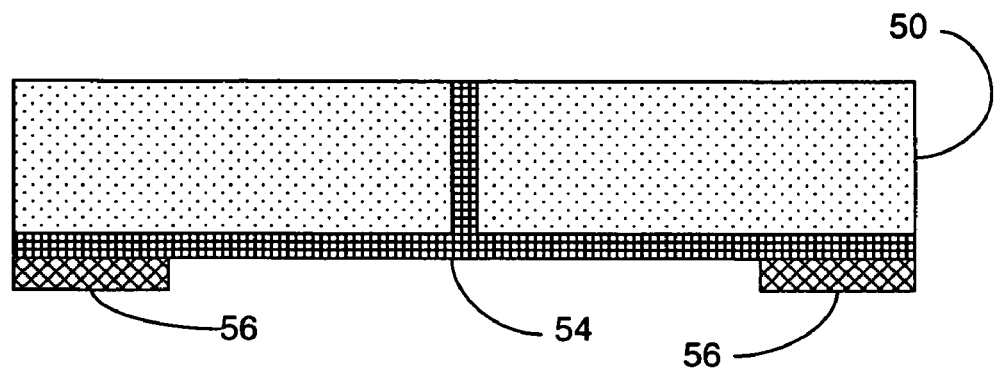
Figure 6C:
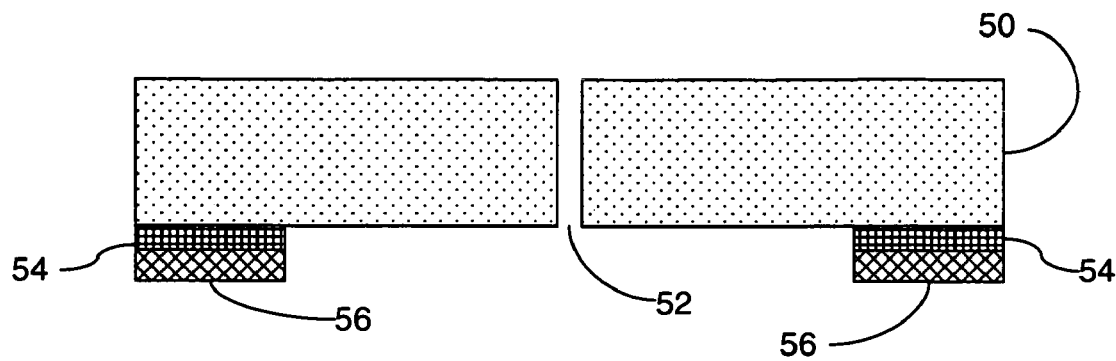
Figure 6D:
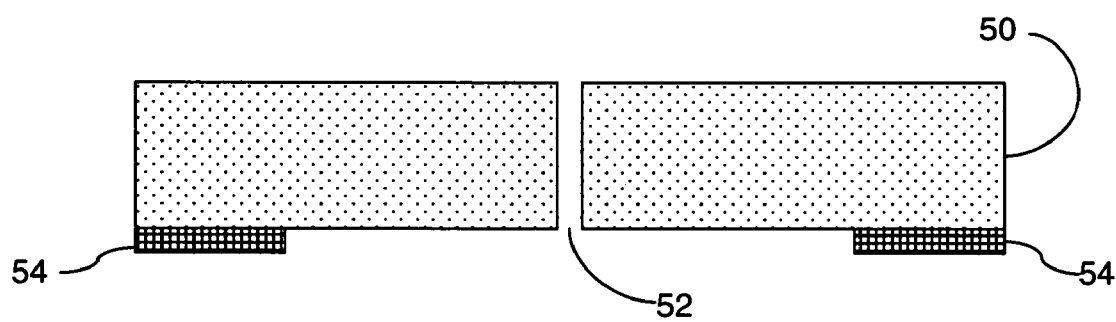
Figure 6E:
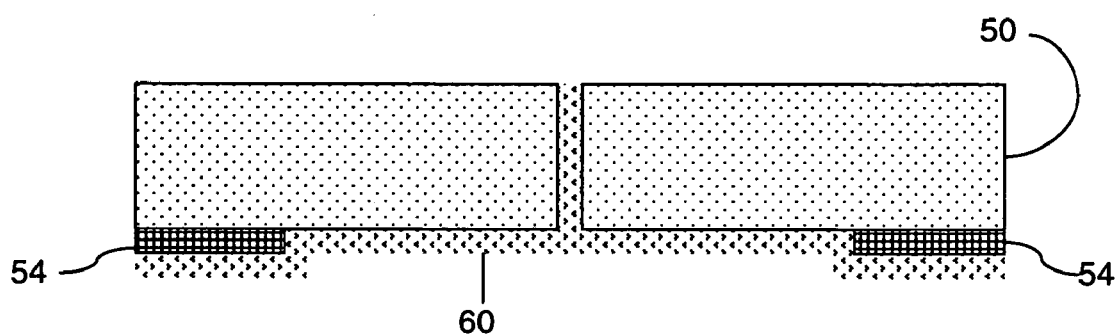

As shown in FIG. 6A, holes 52 are laser drilled and alkaline etched in a silicon substrate, preferably p-type silicon wafer 50. A p-type SOG 54 is then applied to the back side as shown in FIG. 6B, such as BSG or BSG mixed with other p-type dopant oxides, such as Ga, In or Al. A printed etch resist 56 is then applied in a pattern corresponding to the desired grid. Following an etch step, such as HF acid etch, a p-type pattern SOG 54 results, as shown in FIG. 6C. The p-type SOG in hole 52 is also removed during the etch step, such that the remaining structure consists solely of patterned p-type SOG 54 which is covered by resist 56. As shown in FIG. 6D, the resist is then removed, such that only patterned p-type SOG 54 remains on wafer 50. An n-type SOG 60 is then applied to the back side, covering silicon 50, filling hole 52, and covering p-type SOG 54. Any n-type SOG may be employed, preferably PSG.

Figure 6F:
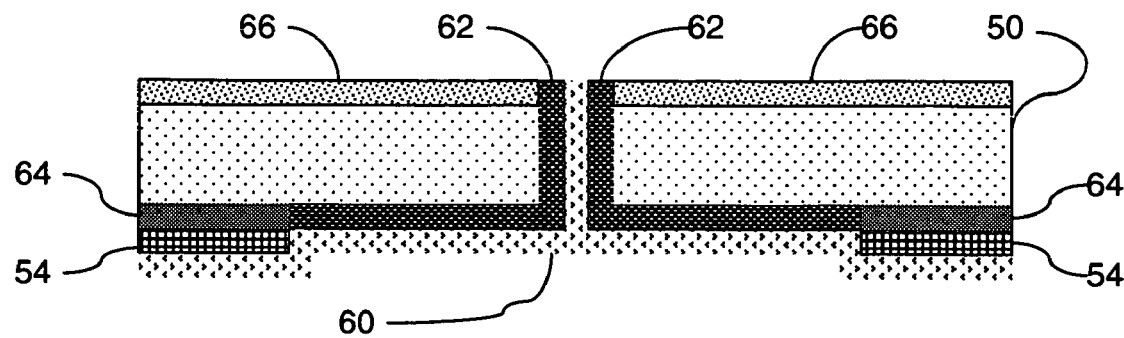
Figure 7:
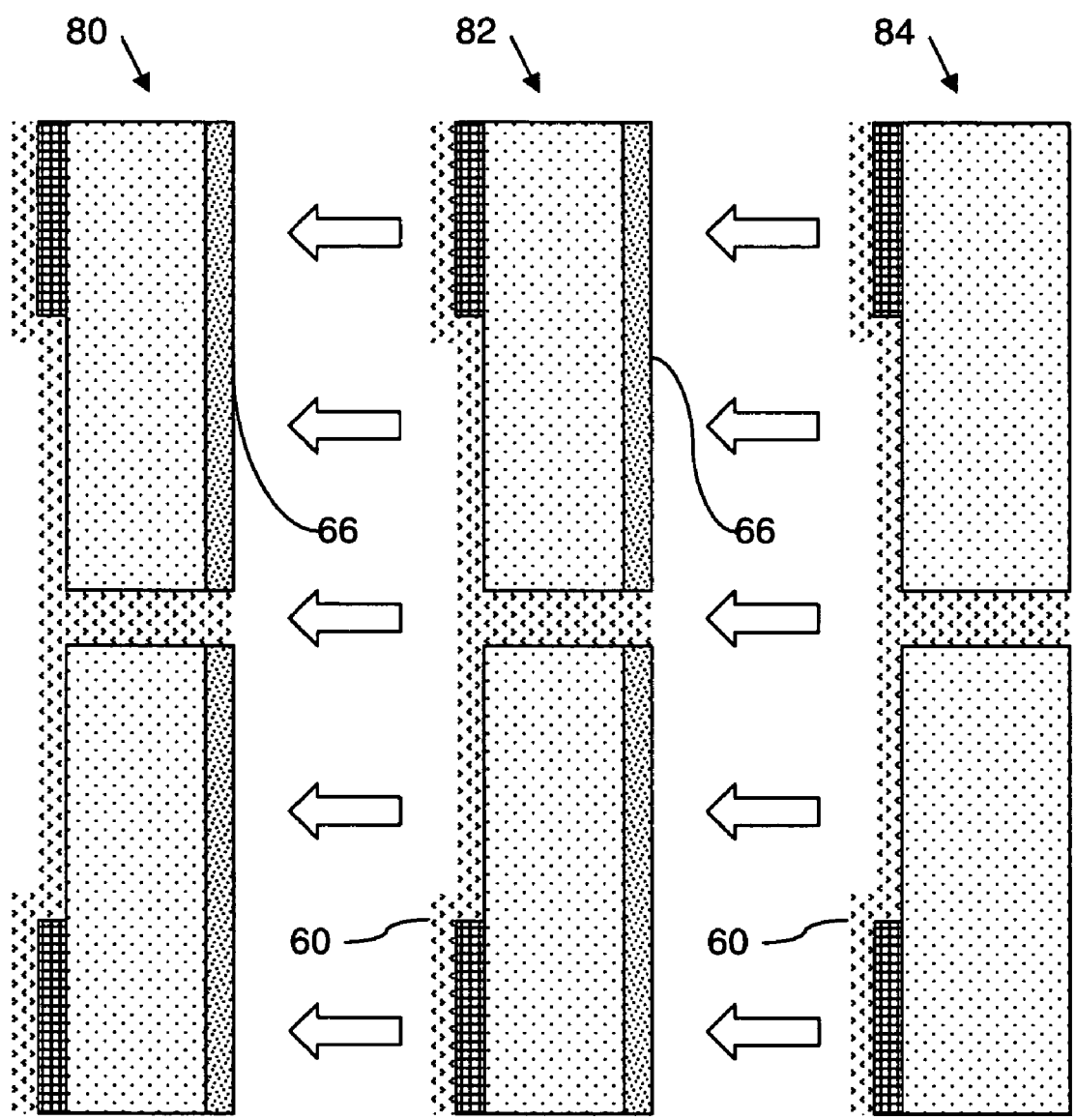
FIG. 7 is a cross-section illustration of an autodoping process of the invention during tube diffusion where wafers are held vertically.

Following application of n-type SOG 60, the wafer is fired at high temperature, such as about 900° C. for 60 minutes in an oxidizing atmosphere to drive in the dopants. As shown in FIG. 6F, this results in heavy n-type diffusion in layers 62 and heavy p-type diffusion in layers 64. A light n-type diffusion layer 66, typically at a resistance of about 80 to 100 $\Omega$/sq, is also simultaneously introduced to the top surface during firing. Light n-type diffusion layer 66 may be introduced by autodoping, as shown in FIG. 7, by exposing the front surface of wafers 80, 82 to the rear surface of n-type SOG 60 coated wafers 82, 84, such that a light diffusion layer 66 is produced by diffusion of phosphorus or other n-type dopants from n-type SOG 60. In FIG. 7, the arrows indicate the direction of diffusion, resulting in layer 66. Thus in this embodiment the light diffusion layer 66 contains a lower phosphorus or other n-type dopant concentration than the interior walls of hole 52. Alternatively, a SOG with lower phosphorus content can be applied to the front surface (not shown) and simultaneously diffused into the front surface. These process variations are described below. In either embodiment these variations produce a more optimal diffusion profile for higher conversion efficiencies.

Figure 6G:
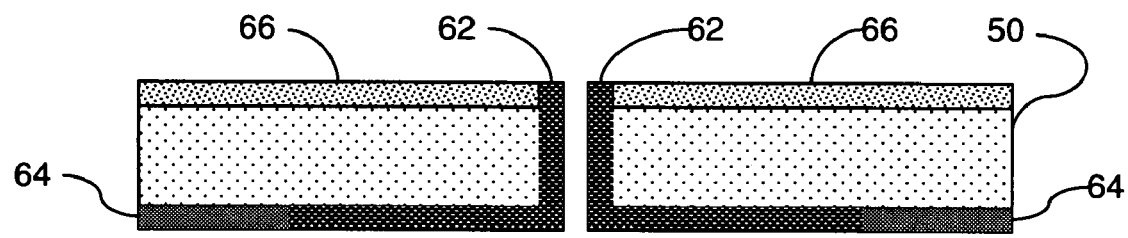
Figure 6H:
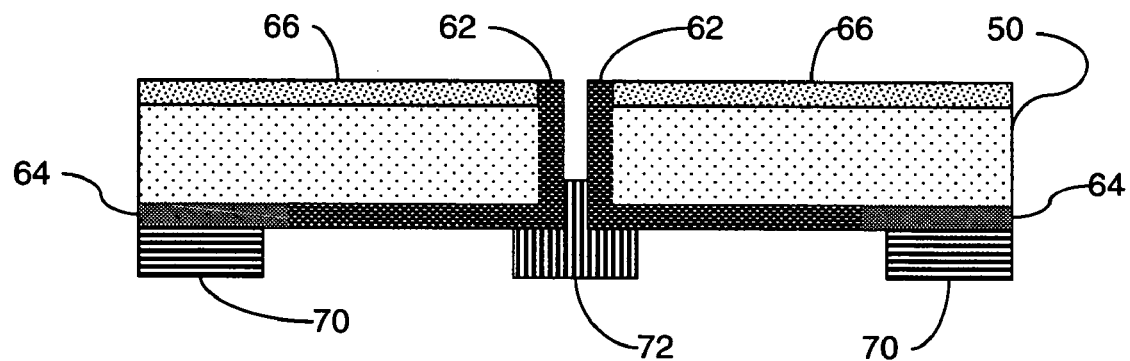

FIG. 6G shows the wafer after the HF acid etch step and removal of the dopant glasses. FIG. 6H shows the completed solar cell, after application of Ag paste for the negative-polarity grid and Ag:Al paste for the positive-polarity grid, resulting after firing in Ag negative-polarity grid contacts 72 and Ag:Al positive-polarity grid contacts 70. The PECVD silicon nitride layers, which may optionally be applied, are not shown for clarity.

The following sequence list illustrates one embodiment of fabrication sequences for a back-contact EWT solar cell using n-type and p-type SOGs and autodoping, it being understood that certain steps may be performed in an order other than that given, and still result in the desired product.

1. Laser drill holes in silicon wafers
2. Alkaline etch
3. Apply SOG with p-type dopants on rear surface
4. Densify SOG
5. Print etch resist
6. HF etch
7. Strip resist and clean wafer
8. Apply SOG with n-type dopants on rear surface
9. Tube furnace drive-in of dopants (optionally with the wafers arrayed so as to facilitate autodoping of the front surfaces)
10. HF etch
11. PECVD nitride on front surface
12. PECVD nitride on rear surface
13. Print Ag for negative-polarity grid
14. Print Ag:Al for positive-polarity grid
15. Fire contacts The following sequence list illustrates an alternative embodiment of fabrication sequences for a back-contact EWT solar cell using n-type and p-type SOGs and a separate SOG for front surface doping, it being understood that certain steps may be performed in an order other than that given, and still result in the desired product.

1. Laser drill holes in silicon wafers
2. Alkaline etch
3. Apply SOG with p-type dopants on rear surface
4. Densify SOG
5. Print etch resist
6. HF etch
7. Strip resist and clean wafer
8. Apply SOG with n-type dopants on rear surface
9. Densify
10. Apply SOG with low-concentration of n-type dopants on front surface
11. Tube furnace drive-in of dopants
12. HF etch
13. PECVD nitride on front surface
14. PECVD nitride on rear surface
15. Print Ag for negative-polarity grid
16. Print Ag:Al for positive-polarity grid
17. Fire contacts Alternatively, the front surface diffusion can be performed in separate step, which allows use of a belt furnace rather than a tube furnace.

The preceding methods can be repeated with similar success by substituting the generically or specifically described reactants and/or operating conditions of this invention for those used in the preceding methods.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A method for making an emitter wrap through (EWT) solar cell, the method comprising the steps of:
    providing a semiconductor wafer with a front surface and a rear surface and a plurality of holes connecting the front surface to the rear surface, the rear surface not coated with a diffusion barrier;
    applying a first dopant diffusion source only on first selected regions of the rear surface in a pattern comprising the rear surface holes;
    applying a second dopant diffusion source only on second selected regions of the rear surface in a pattern not comprising the rear surface holes; and diffusing dopants from the first dopant diffusion source and the second dopant diffusion source into the semiconductor wafer by firing.

2. The method of claim 1 wherein the semiconductor wafer comprises silicon, the first dopant source comprises phosphorus and the second dopant source comprises boron.

3. The method of claim 2 further comprising the step of applying the first dopant diffusion source comprising phosphorus to the front surface in a pattern comprising the front surface holes.

4. The method of claim 1 wherein in the step of applying the first dopant diffusion source at least a portion of the holes are filled with the first dopant diffusion source.

5. The method of claim 1, further comprising the steps of:
etching the semiconductor wafer with an acid solution following the diffusing step;
applying a dielectric layer for passivation to at least the front surface of the etched semiconductor wafer; and
applying a first conductivity type metal grid to the rear surface in a pattern comprising at least a portion of the first dopant diffusion source pattern and a second conductivity type metal grid to the rear surface in a pattern comprising at least a portion of the second dopant diffusion source pattern.

6. A method for making an EWT solar cell, the method comprising the steps of:
providing a semiconductor wafer with a front surface and a rear surface and a plurality of holes connecting the front surface to the rear surface;
printing material for forming a diffusion barrier only on selected regions of the rear surface in a pattern not comprising the rear surface holes without removing the material from unwanted regions;
cleaning the wafer;
diffusing a first dopant into the wafer;
etching the wafer; and
applying a first conductivity type metal grid to the rear surface in a pattern comprising the rear surface holes and a second conductivity type metal grid to the rear surface in a pattern separated from the first conductivity type metal grid by the diffusion barrier pattern.

7. The method of claim 6 wherein the semiconductor wafer comprises p-conductivity type silicon, the first dopant comprises phosphorus, the first conductivity type metal grid comprises silver, and the second conductivity type metal grid comprises aluminum.

8. The method of claim 7 further comprising the steps of:
applying a dielectric layer for passivation to at least a portion of the surface of the p-conductivity type silicon wafer following the etch step;
wherein application of the first dopant phosphorus source results in a resistance of between about 30 and 60 Ω/sq; and
wherein the step of applying first and second conductivity type metal grids comprises printing grid patterns and firing.

9. The method of claim 6 wherein the diffusion barrier comprises a second dopant of opposite conductivity type to the first dopant.

10. The method of claim 9 wherein the first dopant comprises phosphorus and the second dopant forming a part of the diffusion barrier comprises boron.

11. The method of claim 9 wherein the first dopant and second dopant are simultaneously diffused into the wafer.

12. A method for making an EWT solar cell, the method comprising the steps of:
providing a semiconductor wafer with a front surface and a rear surface and a plurality of holes connecting the front surface to the rear surface;
applying a first spin-on glass (SOG) diffusion barrier to the rear surface;
applying a resist in a pattern not comprising the rear surface holes;
etching the wafer to remove first SOG not covered by the patterned resist;
stripping the resist from the wafer;
diffusing a first dopant into the wafer;
etching the wafer to at least remove remaining first SOG; and
applying a first conductivity type metal grid to the rear surface in a pattern comprising the rear surface holes and a second conductivity type metal grid to the rear surface in a pattern comprising the resist pattern.

13. The method of claim 12 wherein the semiconductor wafer comprises silicon, the first dopant comprises phosphorus and applying the first SOG comprises application by spinning or spraying and furnace densification.

14. The method of claim 12 wherein the first SOG comprises a second dopant of opposite conductivity type to the first dopant.

15. A method for making an EWT solar cell, the method comprising the steps of:
providing a semiconductor wafer with a front surface and a rear surface and a plurality of holes connecting the front surface to the rear surface;
applying a first SOG comprising a first dopant to the rear surface;
applying a resist in a pattern not comprising the rear surface holes;
etching the wafer to remove first SOG not covered by the patterned resist;
stripping the resist from the wafer;
applying a second SOG comprising a second dopant of opposite conductivity type to the first dopant to the rear surface;
firing the wafer to diffuse the first dopant and second dopant into the wafer;
etching the wafer to at least remove remaining first and second SOG; and
applying a first conductivity type metal grid to the rear surface in a pattern comprising the rear surface holes and a second conductivity type metal grid to the rear surface in a pattern comprising the resist pattern.

16. The method of claim 15 further comprising the step of applying a third SOG to the front surface of the wafer, the third SOG comprising a lower concentration of second dopant than is in the second SOG.

17. The method of claim 15 wherein firing comprises firing with a plurality of wafers arrayed approximately parallel and front surface to back surface, whereby second dopant from the second SOG on the back surface of a first wafer is diffused to the immediately adjacent front surface of an immediately adjacent second wafer.

* * * * *